US012615925B2

(12) United States Patent
Pang et al.

(10) Patent No.: US 12,615,925 B2
(45) Date of Patent: Apr. 28, 2026

(54) DISPLAY APPARATUS HAVING A LIGHT-EMITTING DEVICE

(71) Applicant: LG Display Co., Ltd., Seoul (KR)

(72) Inventors: Hee Suk Pang, Gumi-si (KR); Joo Hwan Shin, Gumi-si (KR); Suk Yang, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 690 days.

(21) Appl. No.: 18/064,822

(22) Filed: Dec. 12, 2022

(65) Prior Publication Data

US 2023/0209919 A1      Jun. 29, 2023

(30) Foreign Application Priority Data

Dec. 29, 2021      (KR) ...................... 10-2021- 0191748

(51) Int. Cl.
H10K 59/124        (2023.01)
H10K 50/844        (2023.01)

(52) U.S. Cl.
CPC ......... H10K 59/124 (2023.02); H10K 50/844 (2023.02)

(58) Field of Classification Search
CPC ............. H10K 50/844; H10K 59/1201; H10K 59/124; H10K 59/38; H10K 59/87
See application file for complete search history.

(56) References Cited

U.S. PATENT DOCUMENTS

2018/0151642 A1* 5/2018 Oh ...................... H10K 59/8731
2019/0067641 A1* 2/2019 Shin ................... H10K 59/8731

2019/0198819 A1* 6/2019 Shin ....................... H10K 59/38
2021/0183985 A1* 6/2021 Lim ................... H10K 59/8722
2021/0202569 A1* 7/2021 Kim ....................... H10K 59/65

FOREIGN PATENT DOCUMENTS

KR      10-2009-0061387 A      6/2009
KR      10-2017-0135587 A      12/2017

* cited by examiner

*Primary Examiner* — Shaun M Campbell
(74) *Attorney, Agent, or Firm* — Seed Intellectual Property Law Group LLP

(57)        ABSTRACT

A display apparatus including a light-emitting device is provided. The light-emitting device may include a first electrode, a light-emitting layer and a second electrode, which are sequentially stacked on a display area of a device substrate. An over-coat layer may be disposed between the device substrate and the light-emitting device. The light-emitting layer, the second electrode and the over-coat layer may extend on a bezel area of the device substrate. A moisture blocking hole penetrating the over-coat layer of the bezel area may include a first blocking side having a positive tapered shape and a second blocking side having a negative tapered shape. A lower passivation layer between the device substrate and the over-coat layer may include a lower penetrating hole disposed between the first blocking side and the second blocking side. A reflective pattern overlapping with the second blocking side may be disposed between the device substrate and the lower passivation layer. A barrier pattern may be disposed on the first blocking side of the moisture blocking hole. The barrier pattern may extend inside the lower penetrating hole. Thus, in the display apparatus, the deterioration of the light-emitting layer due to penetration of external moisture may be effectively prevented.

20 Claims, 14 Drawing Sheets

T2 | 250 | Cst

T2              250    Cst

DISPLAY APPARATUS HAVING A LIGHT-EMITTING DEVICE

CROSS-REFERENCE TO RELATED APPLICATIONS

This application claims the benefit of Korean Patent Application No. 10-2021-0191748, filed on Dec. 29, 2021, which is hereby incorporated by reference as if fully set forth herein.

BACKGROUND

Technical Field

The present disclosure relates to a display apparatus in which a light-emitting device is disposed on a display area of a device substrate.

Description of the Related Art

Generally, a display apparatus provides an image to a user. For example, the display apparatus may include pixel areas. Each of the pixel areas may realize a specific color. For example, each of the pixel areas includes a light-emitting device. The light-emitting device may emit light displaying a specific color. For example, the light-emitting device may include a first electrode, a light-emitting layer and a second electrode which are sequentially stacked.

The pixel driving circuit electrically connected to the light-emitting device may be disposed in each pixel area. The pixel driving circuit may supply a driving current corresponding to a data signal to the light-emitting device according to a gate signal. For example, the pixel driving circuit may include at least one thin film transistor. A plurality of insulating layers for independently controlling each pixel area may be stacked on the device substrate.

BRIEF SUMMARY

The inventors recognize that light-emitting layer may be vulnerable to moisture. For example, in a display apparatus, the second electrode may cover an end portion of the light-emitting layer. The light-emitting layer may be formed by a deposition process. For example, the light-emitting layer may include a tail portion in which a thickness is gradually reduced. However, in the display apparatus, a size occupied by the second electrode may be increased by the tail portion of the light-emitting layer. Thus, in the display apparatus, non-emission area may be increased. That is, in the display apparatus, an emission area may be relatively decreased, and the quality of the image may be lowered.

The present disclosure is directed to a display apparatus that substantially obviates, among others, one or more problems due to limitations and disadvantages of the related art.

The present disclosure provides a display apparatus capable of preventing the deterioration of the light-emitting layer due to external moisture, without increasing a bezel area.

The present disclosure is to provide a display apparatus capable of reliably preventing the penetration of the external moisture through a tail portion of the light-emitting layer, without decreasing a display area.

Additional advantages, technical solutions, and features of the disclosure will be set forth in part in the description which follows and in part will become apparent to those having ordinary skill in the art upon examination of the following or may be learned from practice of the disclosure. The technical advantages and other advantages of the disclosure may be realized and attained by the structure particularly pointed out in the written description and claims hereof as well as the appended drawings.

In accordance with the purpose of the present disclosure, as embodied and broadly described herein, there is provided a display apparatus comprising a device substrate. The device substrate includes a display area and a bezel area. A reflective pattern is disposed on the bezel area of the device substrate. A separating partition is disposed on the reflective pattern. The separating partition includes a first separation side having a negative tapered shape. An over-coat layer is disposed on the device substrate. The over-coat layer includes an over penetrating hole having a first over side and a second over side. The first over side is spaced away from the first separation side. The second over side overlap the second over side. A lower passivation layer is disposed between the reflective pattern and the separating partition. The lower passivation layer includes a lower penetrating hole. The lower penetrating hole is disposed between the first over side and the first separation side. A light-emitting device is disposed on the over-coat layer of the display area. The light-emitting device includes a first electrode, a light-emitting layer and a second electrode, which are sequentially stacked. A barrier pattern is disposed on the first over side of the over penetrating hole. The barrier pattern extends inside the lower penetrating hole. The light-emitting layer and the second electrode extend on the barrier pattern.

An end portion of the light-emitting layer may be surrounded by the barrier pattern and the second electrode.

The barrier pattern may include the same material as the first electrode of the light-emitting device.

A bank insulating layer covering an edge of the first electrode may extend on the bezel area of the device substrate. An end portion of the barrier pattern may be disposed between the over-coat layer and the bank insulating layer of the bezel area.

A thin film transistor may be disposed between the display area of the device substrate and the lower passivation layer. The reflective pattern may include the same material as a gate electrode of the thin film transistor.

A gate insulating layer of the thin film transistor may extend between the device substrate and the reflective pattern.

A device buffer layer may be disposed between the device substrate and the thin film transistor. The device buffer layer may extend between the device substrate and the reflective pattern. A connecting pattern may be disposed between the device substrate and the device buffer layer. The connecting pattern may include a region overlapping with the reflective pattern. A signal wiring may be disposed between the device buffer layer and the lower passivation layer. The signal wiring may cross the bezel area. The signal wiring may be connected to the connecting pattern at the outside of the reflective pattern.

A light-blocking pattern may be disposed between the device substrate and the device buffer layer. The light-blocking pattern may overlap a semiconductor pattern of the thin film transistor. The connecting pattern may include the same material as the light-blocking pattern.

A color filter may be disposed between the lower passivation layer and the over-coat layer. The color filter may overlap the light-emitting device. The separating partition may include the same material as the color filter.

A side of the color filter may have a positive taper shape.

In an embodiment, there is provided a display apparatus comprising a device substrate. A light-emitting device is disposed on a display area of the device substrate. The light-emitting device includes a first electrode, a light-emitting layer and a second electrode, which are sequentially stacked. An over-coat layer is disposed between the device substrate and the light-emitting layer. The over-coat layer extends on a bezel area of the device substrate. A first moisture blocking hole penetrating the over-coat layer of the bezel area includes a first blocking side and a second blocking side. The first blocking side has a positive tapered shape. The second blocking side has a negative tapered shape. A first reflective pattern is disposed between the bezel area of the device substrate and the over-coat layer. The first reflective pattern overlaps the second blocking side of the first moisture blocking hole. A lower passivation layer is disposed between the first reflective pattern and the over-coat layer. The lower passivation layer including a first lower penetrating hole. The first lower penetrating hole is disposed between the first blocking side and the second blocking side. A first barrier pattern is disposed on the first blocking side of the first moisture blocking hole. The first barrier pattern extends inside the first penetrating hole. The light-emitting layer and the second electrode extend on the first blocking side of the first moisture blocking hole.

The first reflective pattern may be spaced away from the first blocking side of the first moisture blocking hole.

A second moisture blocking hole may be disposed on the bezel area of the device substrate. The second moisture barrier pattern may include a third blocking side and a fourth blocking side. The third blocking side may have a positive tapered shape. The fourth blocking side may have a negative tapered shape. The second moisture blocking hole may be spaced away from the first moisture blocking hole. A second reflective pattern may be disposed between the bezel area of the device substrate and the over-coat layer. The second reflective pattern may be spaced away from the first reflective pattern. The second reflective pattern may overlap the fourth blocking side of the second moisture blocking hole. The lower passivation layer may include a second lower penetrating hole disposed between the third blocking side and the fourth blocking side.

A second barrier pattern may be disposed on the third blocking side of the second moisture blocking hole. The second barrier pattern may extend inside the second lower penetrating hole.

The second barrier pattern may include the same material as the first barrier pattern.

BRIEF DESCRIPTION OF THE SEVERAL VIEWS OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings:

FIG. 4 is an enlarged view of K region in FIG. 3B;

FIGS. 5A to 13A and 5B to 13B are views sequentially showing a method of forming the display apparatus according to an embodiment of the present disclosure;

DETAILED DESCRIPTION

Figures 1, 2:
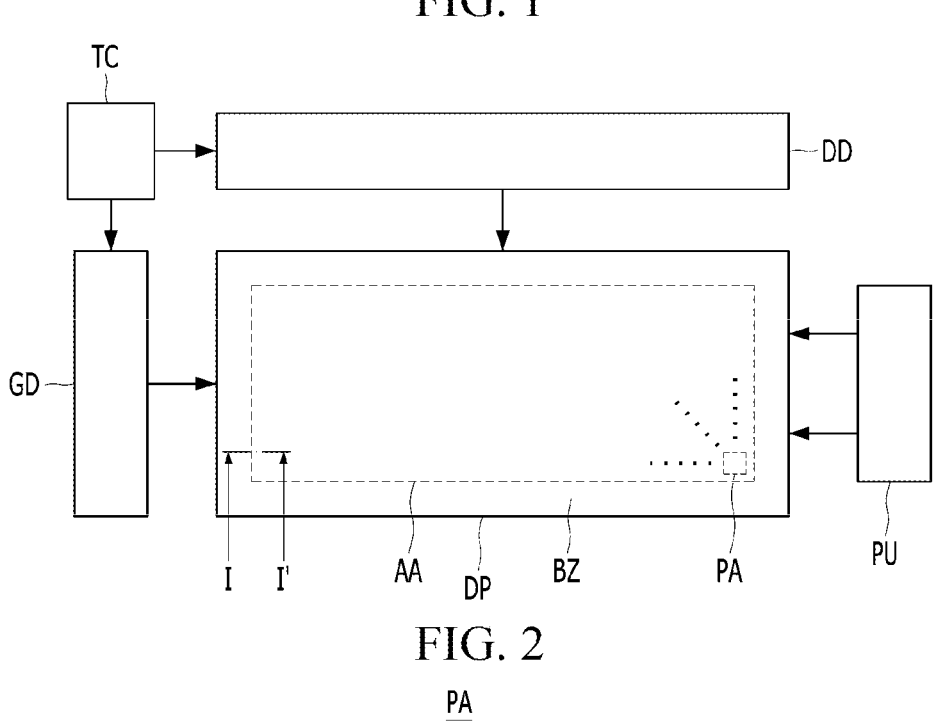
FIG. 1 is a view schematically showing a display apparatus according to an embodiment of the present disclosure.
FIG. 2 is a view showing a circuit of a pixel area in the display apparatus according to the embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected" and "coupled" may include that two components are "connected" or "coupled" through one or more other components located between the two components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

EMBODIMENT

FIG. 1 is a view schematically showing a display apparatus according to an embodiment of the present disclosure.

Figure 3A:
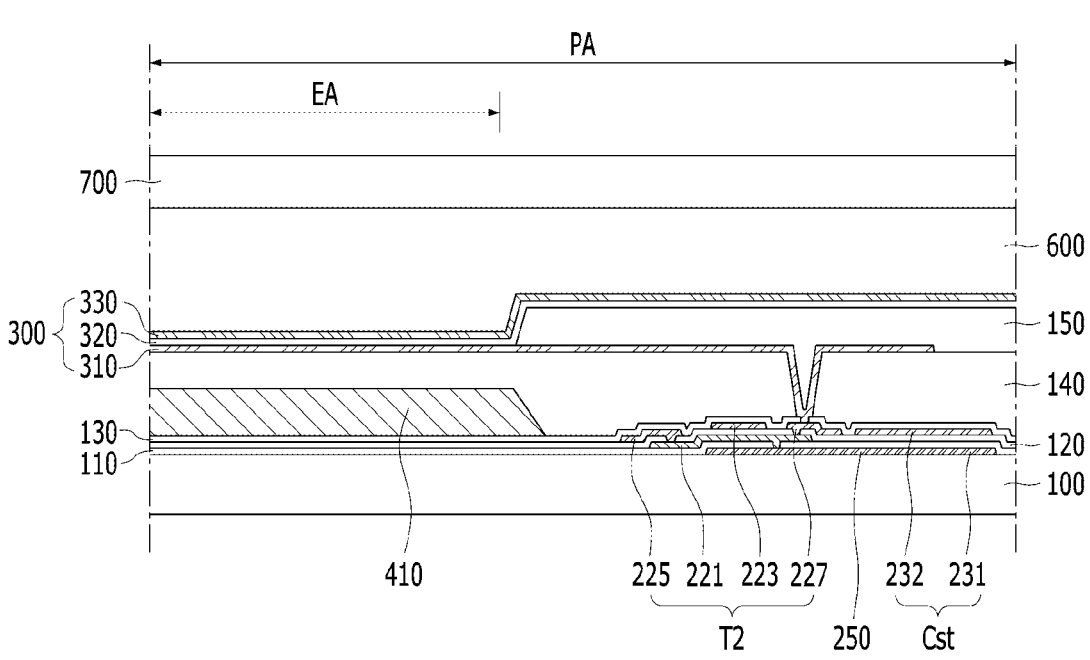
FIG. 3A is a view showing a cross section of the pixel area in the display apparatus according to the embodiment of the present disclosure.
Figure 3B:
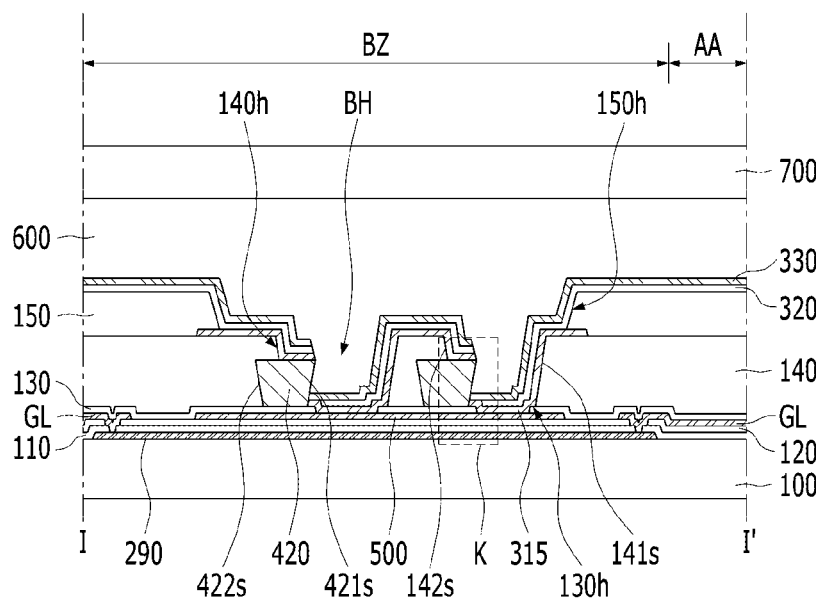
FIG. 3B is a view taken along I-I' of FIG. 1.
Figure 4:
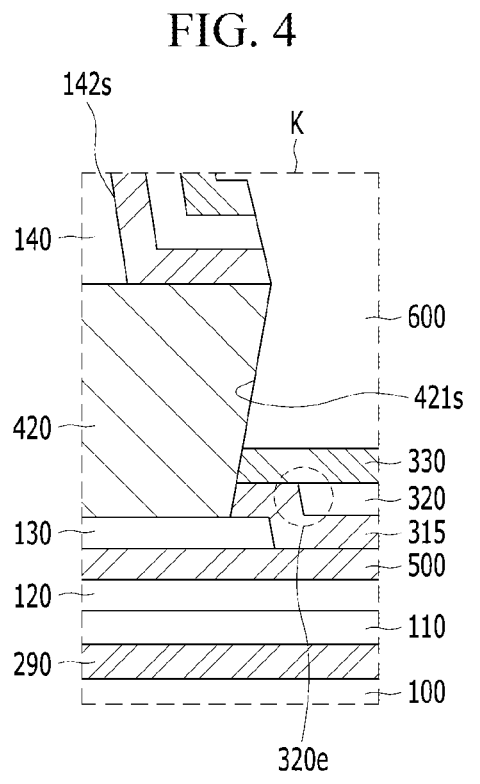

FIG. 2 is a view showing a circuit of a pixel area in the display apparatus according to the embodiment of the present disclosure. FIG. 3A is a view showing a cross section of the pixel area in the display apparatus according to the embodiment of the present disclosure. FIG. 3B is a view taken along I-I' of FIG. 1. FIG. 4 is an enlarged view of K region in FIG. 3B.

Referring to FIGS. 1 to 4, the display apparatus according to the embodiment of the present disclosure may include a display panel DP, a data driver DD, a gate driving GD, a timing controller TC and a power unit PU.

The display panel DP may generate an image being provided to a user. For example, the display panel DP may include a plurality of pixel areas PA. The data driver DD, the gate driver GD, the timing controller TC and the power unit PU may provide a signal for the operation of each pixel area PA through signal wirings DL, GL and PL. The signal wirings DL, GL and PL may include data lines DL, gate lines GL and power voltage supply lines PL. For example, the data driver DD may apply a data signal to each pixel area PA through the data lines DL, the gate driver GD may apply a gate signal to each pixel area PA through the gate lines GL, and the power unit PU may supply a power voltage to each pixel area PA through the power voltage supply lines PL. The timing controller TC may control the data driver DD and the gate driver GD. For example, the data driver DD may receive digital video data and a source timing control signal from the timing controller TC, and the gate driver GD may receive clock signals, reset clock signals and start signals from the timing controller TC.

Each of the pixel areas PA may realize a specific color. For example, a light-emitting device 300 may be disposed in each pixel area PA. The light-emitting device 300 may emit light displaying a specific color. For example, the light-emitting device 300 may include a first electrode 310, a light-emitting layer 320 and a second electrode 330, which are sequentially stacked on a device substrate 100. The device substrate 100 may include an insulating material. The device substrate 100 may include a transparent material. For example, the device substrate 100 may include glass or plastic.

The first electrode 310 may include a conductive material. The first electrode 310 may have a high transmittance. For example, the first electrode 310 may be a transparent electrode made of a transparent conductive material, such as ITO and IZO.

The light-emitting layer 320 may generate light having luminance corresponding to a voltage difference between the first electrode 310 and the second electrode 330. For example, the light-emitting layer 320 may include an emission material layer (EML) having an emission material. The emission material may include an organic material, an inorganic material or a hybrid material. For example, the display apparatus according to the embodiment of the present disclosure may be an organic light-emitting display apparatus including an organic emission material.

The light-emitting layer 320 may have a multi-layer structure. For example, the light-emitting layer 320 may further include at least one of a hole injection layer (HIL), a hole transport layer (HTL), an electron transport layer (ETL) and an electron injection layer (EIL). Thus, in the display apparatus according to the embodiment of the present disclosure, the emission efficiency of the light-emitting layer 320 may be improved.

The second electrode 330 may include a conductive material. The second electrode 330 may include a material different from the first electrode 310. The reflectance of the second electrode 330 may be higher than the reflectance of the first electrode 310. For example, the second electrode 330 may include a metal, such as aluminum (Al) and silver (Ag). Thus, in the display apparatus according to the embodiment of the present disclosure, the light generated by the light-emitting layer 320 may be emitted outside through the first electrode 310 and the device substrate 100.

The pixel driving circuit DC electrically connected to the light-emitting device 300 may be disposed in each pixel area PA. The operation of the light-emitting device 300 in each pixel area PA may be controlled by the pixel driving circuit DC of the corresponding pixel area PA. The pixel driving circuit DC of each pixel area PA may be electrically connected to one of the data lines DL, one of the gate lines GL, and one of the power voltage supply lines PL. For example, the pixel driving circuit DC of each pixel area PA may supply a driving current corresponding to the data signal to the light-emitting device 300 of the corresponding pixel area PA according to the gate signal. The driving current generated by the pixel driving circuit DC of each pixel area PA may apply to the light-emitting device 300 of the corresponding pixel area PA for one frame. For example, the pixel driving circuit DC of each pixel area PA may include a first thin film transistor T1, a second thin film transistor T2 and a storage capacitor Cst.

The first thin film transistor T1 may include a first semiconductor pattern, a first gate electrode, a first source electrode and a first drain electrode. The second thin film transistor T2 may have the same structure as the first thin film transistor T1. For example, the second thin film transistor T2 may include a second semiconductor pattern 221, a second gate electrode 223, a second source electrode 225 and a second drain electrode 227.

The first semiconductor pattern and the second semiconductor pattern 221 may include a semiconductor material. For example, the first semiconductor pattern and the second semiconductor pattern 221 may include an oxide semiconductor, such as IGZO. The second semiconductor pattern 221 may include the same material as the first semiconductor pattern. For example, the second semiconductor pattern 221 may be disposed on the same layer as the first semiconductor pattern. The second semiconductor pattern 221 may be formed simultaneously with the first semiconductor pattern.

Each of the first semiconductor pattern and the second semiconductor pattern 221 may include a source region, a drain region and a channel region. The channel region may be disposed between the source region and the drain region. The source region and the drain region may have a resistance lower than the channel region. For example, the source region and the drain region may include a conductorized region of an oxide semiconductor. The channel region may be a region of an oxide semiconductor, which may be not a conductorized.

The first gate electrode and the second gate electrode 223 may include a conductive material. For example, the first gate electrode and the second gate electrode 223 may include a metal, such as aluminum (Al), chrome (Cr), copper (Cu), molybdenum (Mo), titanium (Ti) and tungsten (W). The second gate electrode 223 may include the same material as the first gate electrode. For example, the second gate electrode 223 may be disposed on the same layer as the first gate electrode. The second gate electrode 223 may be formed simultaneously with the first gate electrode.

The first gate electrode may be disposed on the first semiconductor pattern. For example, the first gate electrode may overlap the channel region of the first semiconductor pattern. The first gate electrode may be insulated from the first semiconductor pattern. For example, the channel region of the first semiconductor pattern may have an electric conductivity corresponding to a voltage applied to the first gate electrode. The second gate electrode 223 may be disposed on the second semiconductor pattern 221. For example, the second gate electrode 223 may overlap the channel region of the second semiconductor pattern 221. The second gate electrode 223 may be insulated from the second semiconductor pattern 221. The channel region of the second semiconductor pattern 221 may have an electric conductivity corresponding to a voltage applied to the second gate electrode 223.

The first source electrode, the first drain electrode, the second source electrode 225 and the second drain electrode 227 may include a conductive material. For example, the first source electrode, the first drain electrode, the second source electrode 225 and the second drain electrode 227 may include a metal, such as aluminum (Al), chrome (Cr), copper (Cu), molybdenum (Mo), titanium (Ti) and tungsten (W). The first drain electrode may include the same material as the first source electrode. For example, the first drain electrode may be disposed on the same layer as the first source electrode. The first drain electrode may be formed simultaneously with the first source electrode. The second drain electrode 227 may include the same material as the second source electrode 225. For example, the second drain electrode 227 may be disposed on the same layer as the second source electrode 225. The second drain electrode 227 may be formed simultaneously with the second source electrode 225.

The first source electrode and the first drain electrode may include the same material as the first gate electrode. For example, the first source electrode and the first drain electrode may be disposed on the same layer as the first gate electrode. The first source electrode and the first drain electrode may be formed simultaneously with the first gate electrode. The first source electrode and the first drain electrode may be insulated from the first gate electrode. For example, the first source electrode and the first drain electrode may be spaced away from the first gate electrode.

The second source electrode 225 and the second drain electrode 227 may include the same material as the second gate electrode 223. For example, the second source electrode 225 and the second drain electrode 227 may be disposed on the same layer as the second gate electrode 223. The second source electrode 225 and the second drain electrode 227 may be formed simultaneously with the second gate electrode 223. The second source electrode 225 and the second drain electrode 227 may be insulated from the second gate electrode 223. For example, the second source electrode 225 and the second drain electrode 227 may be spaced away from the second gate electrode 223.

The first source electrode may be electrically connected to the source region of the first semiconductor pattern. The first drain electrode may be electrically connected to the drain region of the first semiconductor pattern. The second source electrode 225 may be electrically connected to the source region of the second semiconductor pattern 221. The second drain electrode 227 may be electrically connected to the drain region of the second semiconductor pattern 221. The second source electrode 225 and the second drain electrode 227 may include the same material as the first source electrode and the first drain electrode. For example, the second source electrode 225 and the second drain electrode 227 may be disposed on the same layer as the first source electrode and the first drain electrode. The second source electrode 225 and the second drain electrode 227 may be disposed on the same layer as the first source electrode and the first drain electrode. The second source electrode 225 and the second drain electrode 227 may be formed simultaneously with the first source electrode and the first drain electrode. The first source electrode, the first drain electrode, the second source electrode 225 and the second drain electrode 227 may be spaced away from each other.

The thin film transistors T1 and T2 of each pixel area PA may be disposed between the device substrate 100 and the light-emitting device 300 of the corresponding pixel area PA. For example, at least one of insulating layers 110, 120, 130, 140 and 150 may be disposed on the device substrate 100. Thus, in the display apparatus according to the embodiment of the present disclosure, unnecessary connection between the thin film transistors T1 and T2 and the light-emitting device 300 of each pixel area PA may be prevented. For example, a device buffer layer 110, a gate insulating layer 120, a lower passivation layer 130, an over-coat layer 140 and a bank insulating layer 150 may be sequentially stacked on the device substrate 100.

The device buffer layer 110 may include an insulating material. For example, the device buffer layer 110 may include an inorganic insulating material, such as silicon oxide (SiO) and silicon nitride (SiN). The device buffer layer 110 may include a multi-layer structure. For example, the device buffer layer 110 may have a stacked structure of a layer made of silicon nitride (SiN) and a layer made of silicon oxide (SiO).

The device buffer layer 110 may be disposed between the device substrate 100 and the thin film transistors T1 and T2 of each pixel area PA. The device buffer layer 110 may prevent pollution due to the device substrate 100 in a process of forming the thin film transistors T1 and T2. For example, an entire surface of the device substrate 100 toward the thin film transistors T1 and T2 of each pixel area PA may be covered by the device buffer layer 110. The thin film transistors T1 and T2 of each pixel area PA may be disposed on the device buffer layer 110.

The gate insulating layer 120 may include an insulating material. For example, the gate insulating layer 120 may include an inorganic insulating material, such as silicon oxide (SiO) and silicon nitride (SiN). The gate insulating layer 120 may include a material having a high dielectric constant. For example, the gate insulating layer 120 may include a High-K material, such as hafnium oxide (HfO). The gate insulating layer 120 may have a multi-layer structure.

The gate insulating layer 120 may be disposed on the device buffer layer 110. The gate insulating layer 120 may extend between the semiconductor pattern 221 and the gate electrode 223 of each thin film transistor T1 and T2. For example, the gate electrode 223 of each thin film transistor T1 and T2 may be insulated from the semiconductor pattern 221 of the corresponding thin film transistor T1 and T2 by the gate insulating layer 120. The gate insulating layer 120 may cover the first semiconductor pattern and the second semiconductor pattern 221 of each pixel area PA. The first gate electrode and the second gate electrode 223 of each pixel area PA may be disposed on the gate insulating layer 120.

The first source electrode, the first drain electrode, the second source electrode 225 and the second drain electrode 227 of each pixel area PA may be disposed on the gate insulating layer 120. For example, the gate insulating layer 120 of each pixel area PA may include a first source contact hole exposing the source region of the first semiconductor pattern, a first drain contact hole exposing the drain region of the first semiconductor pattern, a second source contact hole exposing the source region of the second semiconductor pattern 221, and a second drain contact hole exposing the drain region of the second semiconductor pattern 221.

The lower passivation layer 130 may include an insulating material. For example, the lower passivation layer 130 may include an inorganic insulating material, such as silicon oxide (SiO) and silicon nitride (SiN).

The lower passivation layer 130 may be disposed on the gate insulating layer 120. The lower passivation layer 130 may prevent the damage of each thin film transistor T1 and T2 due to external impact and moisture. For example, the first gate electrode, the first source electrode, the first drain electrode, the second gate electrode 223, the second source electrode 225 and the second drain electrode 227 of each pixel area PA may be covered by the lower passivation layer 130. The lower passivation layer 130 may extend along a surface of each thin film transistor T1 and T2 opposite to the device substrate 100. The lower passivation layer 130 may be in direct contact with the gate insulating layer 120 at the outside of the thin film transistors T1 and T2 in each pixel area PA.

The over-coat layer 140 may include an insulating material. The over-coat layer 140 may include a material different from the lower passivation layer 130. For example, the over-coat layer 140 may include an organic insulating material.

The over-coat layer 140 may be disposed on the lower passivation layer 130. The over-coat layer 140 may remove a thickness difference due to the thin film transistors T1 and T2 of each pixel area PA. For example, an upper surface of the over-coat layer 140 opposite to the device substrate 100 may be a flat surface. The first electrode 310, the light-emitting layer 320 and the second electrode 330 of each pixel area PA may be sequentially stacked on the upper surface of the over-coat layer 140. For example, the first electrode 310 of each pixel area PA may be electrically connected to the second thin film transistor T2 of the corresponding pixel area PA through one of electrode contact holes penetrating the over-coat layer 140. Thus, in the display apparatus according to the embodiment of the present disclosure, the characteristics deviation due to the generating position difference of the light emitted outside through the device substrate 100 may be prevented.

The bank insulating layer 150 may include an insulating material. For example, the bank insulating layer 150 may include an organic insulating material. The bank insulating layer 150 may include a material different from the over-coat layer 140.

The bank insulating layer 150 may be disposed on the over-coat layer 140. The first electrode 310 of each light-emitting device 300 may be insulated from the first electrode 310 of adjacent light-emitting device 300 by the bank insulating layer 150. For example, the bank insulating layer 150 may cover an edge of the first electrode 310 in each pixel area PA. Thus, in the display apparatus according to the embodiment of the present disclosure, the light-emitting device 300 of each pixel area PA may be independently controlled by the bank insulating layer 150. The light-emitting layer 320 and the second electrode 330 of each light-emitting device 300 may be stacked on a portion of the corresponding first electrode 310 exposed by the bank insulating layer 150. For example, the bank insulating layer 150 may define emission area EA in each pixel area PA.

The emission area EA of each pixel area PA defined by the bank insulating layer 150 may be not overlap with the pixel driving circuit DC of the corresponding pixel area PA. For example, the thin film transistors T1 and T2 of each pixel area PA may be disposed outside the emission area EA of the corresponding pixel area PA. Thus, in the display apparatus according to the embodiment of the present disclosure, the light emitted from the light-emitting device 300 of each pixel area PA may be not blocked by the thin film transistors T1 and T2 of the corresponding pixel area PA.

The light-emitting layer 320 of each light-emitting device 300 may be connected to the light-emitting layer 320 of adjacent light-emitting device 300. For example, the light-emitting layer 320 of each light-emitting device 300 may extend onto the bank insulating layer 150. The light emitted from the light-emitting device 300 of each pixel area PA may display the same color as the light emitted from the light-emitting device 300 of adjacent pixel area PA. For example, the light-emitting layer 320 of each pixel area PA may generate white light.

Each of the pixel areas PA may realize a color different from adjacent pixel area PA. For example, each of the pixel area PA may include a color filter 410 overlapping with the emission area EA of the corresponding pixel area PA. The color filter 410 may realize a specific color using light passing therethrough. For example, the color filter 410 of each pixel area PA may be disposed on a path of the light emitted from the light-emitting device 300 in the corresponding pixel area PA. The color filter 410 of each pixel area PA may be disposed between the device substrate 100 and the light-emitting device 300 of the corresponding pixel area PA. For example, the color filter 410 of each pixel area PA may be disposed between the device passivation layer 130 and the over-coat layer 140. A thickness difference due to the color filter 410 of each pixel area PA may be removed by the over-coat layer 140.

A voltage applied to the second electrode 330 of each light-emitting device 300 may be the same as a voltage applied to the second electrode 330 of adjacent light-emitting device 300. For example, the second electrode 330 of each light-emitting device 300 may be electrically connected to the second electrode 330 of adjacent light-emitting device 300. The second electrode 330 of each light-emitting device 300 may include the same material as the second electrode 330 of adjacent light-emitting device 300. For example, the second electrode 330 of each light-emitting device 300 may be formed simultaneously with the second electrode 330 of adjacent light-emitting device 300. Thus, in the display apparatus according to the embodiment of the present disclosure, a process of forming the second electrode 330 of each light-emitting device 300 may be simplified.

A light-blocking pattern 250 may be disposed between the device substrate 100 and each thin film transistor T1 and T2. For example, the light-blocking pattern 250 may be disposed between the device substrate 100 and the device buffer layer 110. The light-blocking pattern 250 may include a material capable of absorbing or reflecting light. The light-blocking pattern 250 may include a conductive material. For example, the light-blocking pattern 250 may include a metal, such as aluminum (Al), chrome (Cr), copper (Cu), molybdenum (Mo), titanium (Ti) and tungsten (W).

External light travelling in a direction of the semiconductor pattern 221 of each thin film transistor T1 and T2 may be blocked by the light-blocking pattern 250. For example, the light-blocking pattern 250 may include a region overlapping with the channel region of each semiconductor pattern 221. Thus, in the display apparatus according to the embodiment of the present disclosure, a characteristics change of each thin film transistor T1 and T2 due to the external light may be prevented.

The first thin film transistor T1 of each pixel driving circuit DC may transmit the data signal to the second thin film transistor T2 of the corresponding pixel driving circuit DC according to the gate signal. For example, the first gate electrode of each pixel driving circuit DC may be electrically connected to one of the gate lines GL, and the first source electrode of each pixel driving circuit DC may be electrically connected to one of the data lines DL. The second thin film transistor T2 of each pixel driving circuit DC may generate the driving current corresponding to the data signal. For example, the second gate electrode 223 of each pixel driving circuit DC may be electrically connected to the first drain electrode of the corresponding pixel driving circuit DC, and the second source electrode 225 of each pixel driving circuit DC may be electrically connected to one of the power voltage supply lines PL. The driving current generated by the second thin film transistor T2 of each pixel area PA may be provided to the light-emitting device 300 of the corresponding pixel area PA. For example, the first electrode 310 of each pixel area PA may be electrically connected to the second drain electrode 227 of the corresponding pixel area PA.

The gate lines GL may be disposed on the same layer as the gate electrode 223 of each thin film transistor T1 and T2. For example, the gate lines GL may be disposed between the gate insulating layer 120 and the lower passivation layer 130. The gate lines GL may include the same material as the gate electrode 223 of each thin film transistor T1 and T2. For example, the gate lines GL may be formed simultaneously with the gate electrode 223 of each thin film transistor T1 and T2. The first gate electrode of each pixel area PA may be in direct contact with the corresponding gate line GL.

The data lines DL may intersect the gate lines GL. The data lines DL may be disposed on a layer different from the gate lines GL. For example, the data lines DL may be disposed between the device substrate 100 and the device buffer layer 110. The data lines DL may include the same material as the light-blocking pattern 250. For example, the data lines DL may be formed simultaneously with the light-blocking pattern 250. The device buffer layer 110 and the gate insulating layer 120 may include data contact holes exposing a portion of each data line DL. The first source electrode of each pixel area PA may be connected to the corresponding data line DL through one of the data contact holes.

The power voltage supply lines PL may extend in parallel to the data lines DL. For example, the power voltage supply lines PL may intersect the gate lines GL. The power voltage supply lines PL may be disposed on the same layer as the data lines DL. For example, the power voltage supply lines PL may be disposed between the device substrate 100 and the device buffer layer 110. The power voltage supply lines PL may include the same material as the data lines DL. For example, the power voltage supply lines PL may be formed simultaneously with the data lines DL. The device buffer layer 110 and the gate insulating layer 120 may include power contact holes exposing a portion of each power voltage supply line PL. The second source electrode 225 of each pixel area PA may be connected to the corresponding power voltage supply line PL through one of the power contact holes.

The storage capacitor Cst of each pixel driving circuit DC may maintain a signal applied to the second gate electrode 223 of the corresponding pixel driving circuit DC for one frame. For example, the storage capacitor Cst of each pixel driving circuit DC may be electrically connected between the second gate electrode 223 and the second drain electrode 227 of the corresponding pixel driving circuit DC. The storage capacitor Cst of each pixel driving circuit DC may have a structure in which at least two capacitor electrodes 231 and 232 are stacked. For example, the storage capacitor Cst of each pixel driving circuit DC may have a stacked structure of a first capacitor electrode 231 and a second capacitor electrode 232. The second capacitor electrode 232 of each pixel driving circuit DC may be disposed on the first capacitor electrode 231 of the corresponding pixel driving circuit DC. The second capacitor electrode 232 of each pixel driving circuit DC may be insulated from the first capacitor electrode 231 of the corresponding pixel driving circuit DC. The storage capacitor Cst of each pixel driving circuit DC may be formed using a conductive layer disposed between the device substrate 100 and the over-coat layer 140. For example, the first capacitor electrode 231 of each pixel driving circuit DC may be disposed between the device substrate 100 and the device buffer layer 110, and the second capacitor electrode 232 of each pixel driving circuit DC may be disposed between the gate insulating layer 120 and the lower passivation layer 130.

The first capacitor electrode 231 of each pixel driving circuit DC may include the same material as the light-blocking pattern 250. For example, the first capacitor electrode 231 of each pixel driving circuit DC may include a metal, such as aluminum (Al), chrome (Cr), copper (Cu), molybdenum (Mo), titanium (Ti), tungsten (W). The first capacitor electrode 231 of each pixel driving circuit DC may be formed simultaneously with the light-blocking pattern 250. For example, the first capacitor electrode 231 of each pixel driving circuit DC may be in direct contact with the light-blocking pattern 250 disposed in the corresponding pixel area PA.

The first capacitor electrode 231 of each pixel driving circuit DC may be electrically connected to the second drain electrode 227 of the corresponding pixel driving circuit DC. For example, the first capacitor electrode 231 of each pixel driving circuit DC may be connected to the second drain electrode 227 of the corresponding pixel driving circuit DC through the light-blocking pattern 250 and the drain region of the second semiconductor pattern 221, which are disposed in the corresponding pixel area PA. The drain region of the second semiconductor pattern 221 in each pixel area PA may be electrically connected to the light-blocking pattern 250 in the corresponding pixel area PA. For example, the device buffer layer 110 may include storage contact holes disposed between the light-blocking pattern 250 and the drain region of the second semiconductor pattern 221 in each pixel area PA. The drain region of the second semiconductor pattern 221 in each pixel area PA may be connected to the light-blocking pattern 250 in the corresponding pixel area PA through one of the storage contact holes.

The second capacitor electrode 232 of each pixel driving circuit DC may include the same material as the gate electrodes 230 of the corresponding pixel driving circuit DC. For example, the second capacitor electrode 232 of each pixel driving circuit DC may include a metal, such as aluminum (Al), chrome (Cr), copper (Cu), molybdenum (Mo), titanium (Ti), tungsten (W). The second capacitor electrode 232 of each pixel driving circuit DC may be formed simultaneously with the gate electrodes 230 of the corresponding pixel driving circuit DC.

The display panel DP may include a display area AA in which the pixel areas PA are disposed, and a bezel area BZ disposed outside the display area AA. For example, the light-emitting devices 300 may be disposed on the over-coat layer 130 of the display area AA. The bezel area BZ may surround the display area AA. The signal wirings DL, GL and PL may be connected to the pixel driving circuit DC of each pixel area PA across the bezel area BZ. For example, the data lines DL, the gate lines GL and the power voltage supply lines PL, which are electrically connected to the pixel driving circuit DC of each pixel area PA may extend on the bezel area BZ of the device substrate 100.

At least one of insulating layers 110, 120, 130, 140 and 150 for insulating between the signal wirings DL, GL and PL may be disposed on the bezel area BZ of the device substrate 100. For example, the device buffer layer 110, the gate insulating layer 120, the lower passivation layer 130, the over-coat layer 140 and the bank insulating layer 150 may extend on the bezel area BZ of the device substrate 100. The device buffer layer 110, the gate insulating layer 120, the lower passivation layer 130, the over-coat layer 140 and the bank insulating layer 150 may be sequentially stacked on the bezel area BZ of the device substrate 100.

The over-coat layer 140 may include at least one over penetrating hole 140h disposed on the bezel area BZ of the device substrate 100. The over penetrating hole 140h may penetrate the over-coat layer 140 of the bezel area BZ. For example, the over penetrating hole 140h may include a first over side 141s toward the display area AA, and a second over side 142s opposite to the first over side 141s. The first over side 141s and the second over side 142s may have a positive tapered shape. For example, a width of the over penetrating hole 140h may decrease as a distance from the device substrate 100 decreases.

At least one separating partition 420 may be disposed between the lower passivation layer 130 and the over-coat layer 140 of the bezel area BZ. The separating partition 420 may include an insulating material. For example, the separating partition 420 may include the same material as the color filter 410. The separating partition 420 may include a first separation side 421s toward the display area AA, and a second separation side 422s opposite to the first separation side 421s. The first separation side 421s and the second separation side 422s may have a negative tapered shape. For example, a width of the separating partition 420 may decrease as a distance from the device substrate 100 decreases.

The separating partition 420 may include a region disposed in the over penetrating hole 140h. For example, the first separation side 421s of the separating partition 420 may be disposed in the over penetrating hole 140h. The second separation side 422s of the separating partition 420 may be disposed between the lower passivation layer 130 and the over-coat layer 140 of the bezel area BZ. For example, the second over side 142s of the over penetrating hole 140h may overlap the separating partition 420.

The over-coat layer 140 and the separating partition 420 of the bezel area BZ may define at least one moisture blocking hole BH. For example, the moisture blocking hole BH may be disposed between the first over side 141s of the over penetrating hole 140h and the first separation side 421s of the separating partition 420. The first over side 141s of the over penetrating hole 140h may be defined as a first blocking side of the moisture blocking hole BH. The first separation side 421s of the separating partition BH may be defined as a second blocking side of the moisture blocking hole BH. That is, in the display apparatus according to the embodiment of the present disclosure, the moisture blocking hole BH defined by the over-coat layer 140 of the bezel area BZ and the separating partition 420 may include the first blocking side 141s having a positive tapered shape and the second blocking side 421s having a negative tapered shape. The first blocking side 141s of the moisture blocking hole BH may face the display area AA. The moisture blocking hole BH may penetrate the over-coat layer 140 of bezel area BZ.

A reflective pattern 500 may be disposed between the gate insulating layer 120 and the lower passivation layer 130 of the bezel area BZ. The reflective pattern 500 may include a material having a high reflectance. For example, the reflective pattern 500 may include a metal. The reflective pattern 500 may be formed using a process of forming the pixel driving circuit DC in each pixel area PA. For example, the reflective pattern 500 may include the same material as the second gate electrode 223 of the second thin film transistor T2 in each pixel area PA.

The reflective pattern 500 may overlap the moisture blocking hole BH and the separating partition 420. For example, the first over side 141s and the second over side 142s of the over penetrating hole 140h may be disposed on the reflective pattern 500. The over penetrating hole 140h may overlap the reflective pattern 500. The reflective pattern 500 may extend beyond the over penetrating hole 140h and the separating partition 420. For example, the second separation side 422s of the separating partition 420 may be disposed on the reflective pattern 500.

The lower passivation layer 130 may include a lower penetrating hole 130h overlapping with the moisture blocking hole BH. For example, the lower penetrating hole 130h may be disposed between the first blocking side 141s and the second blocking side 421s of the moisture blocking hole BH. The lower penetrating hole BH may penetrate the lower passivation layer 130. For example, a portion of the reflective pattern 500 may be exposed by the lower penetrating hole 130h and the moisture blocking hole BH.

A barrier pattern 315 may be disposed on the first blocking side 141s of the moisture blocking hole BH. The barrier pattern 315 may include a material capable of preventing the penetration of the external moisture. The barrier pattern 315 may be formed using a process of forming the light-emitting device 300. For example, the barrier pattern 315 may include the same material as the first electrode 310 in each pixel area PA. The barrier pattern 315 may be in direct contact with the over-coat layer 140. For example, the first blocking side 141s of the moisture blocking hole BH may be in direct contact with the barrier pattern 315.

The barrier pattern 315 may extend inside the lower penetrating hole 130h. For example, the portion of the reflective pattern 500 exposed by the lower penetrating hole 130h may be covered by the barrier pattern 315. The barrier pattern 315 may be in direct contact with the reflective pattern 500 in the lower penetrating hole 130h. Thus, in the display apparatus according to the embodiment of the present disclosure, the penetration of the external moisture through the first blocking side 141s of the moisture blocking hole BH may be prevented by the barrier pattern 315.

The light-emitting layer 320 and the second electrode 330 of each light-emitting device 300 may extend on the bezel area BZ of the device substrate 100. For example, the light-emitting layer 320 and the second electrode 330 may be stacked on the barrier pattern 315. The bank insulating layer 150 of the bezel area BZ may include an opening 150h overlapping with the over penetrating hole 140h and the separating partition 420. The light-emitting layer 320 and the second electrode 330 may extend inside the lower penetrating hole 130h. The light-emitting layer 320 and the second electrode 330 may be partially separated by the first separation side 421s of the separating partition 420. For example, the light-emitting layer 320 may include an end portion disposed in the moisture blocking hole BH. The end portion 320e of the light-emitting layer 320 may be disposed on the barrier pattern 315. The second electrode 330 may be in direct contact with the barrier pattern 315 at the outside of the light-emitting layer 320. For example, the barrier pattern 315 and the second electrode 330 may surround the end portion 320e of the light-emitting layer 320 in the moisture blocking hole BH. Thus, in the display apparatus according to the embodiment of the present disclosure, the penetration of the external moisture through the light-emitting layer 320 may be prevented, regardless of the tail portion of the light-emitting layer 320. Therefore, in the display apparatus according to the embodiment of the present disclosure, the deterioration of the light-emitting layer 320 due to the external moisture may be prevented, without increasing the bezel area BZ.

And, the moisture blocking hole BH may be disposed between the display area AA and the separating partition 420. That is, in the display apparatus according to the embodiment of the present disclosure, the penetration of the external moisture through the separating partition 420 may be prevented. Thus, in the display apparatus according to the embodiment of the present disclosure, the degree of freedom for a material of the separating partition 420 may be improved. Therefore, in the display apparatus according to the embodiment of the present disclosure, the penetration of the external moisture may be effectively prevented.

A connecting pattern 290 may be disposed between the bezel area BZ of the device substrate 100 and the device buffer layer 110. The connecting pattern 290 may include a conductive material. For example, the connecting pattern 290 may include the same material as the light-blocking pattern 250. The connecting pattern 290 may overlap the reflective pattern 500. The signal wirings DL, GL and PL between the gate insulating layer 120 and the lower passivation layer 130 may cross the bezel area BZ using the connecting pattern 290. For example, each of the gate lines GL disposed on the same layer as the reflective pattern 500 may cross the moisture blocking hole BH using the connecting pattern 290. Each of the gate lines GL may be electrically connected to the connecting pattern 290 at the outside of the reflective pattern 500. That is, in the display apparatus according to the embodiment of the present disclosure, each of the signal wirings DL, GL and PL disposed on the same layer as the reflective pattern 500 may bypass the reflective pattern 500 using the connecting pattern 290. Each of the gate lines GL may penetrate the device buffer layer 110 and the gate insulating layer 120. Thus, in the display apparatus according to the embodiment of the present disclosure, the external moisture penetrating through the interface between the device buffer layer 110 and the gate insulating layer 120 may be blocked by the gate lines GL. Therefore, in the display apparatus according to the embodiment of the present disclosure, the disconnection of the signal wirings DL, GL and PL may be prevented, and the deterioration of the light-emitting layer 320 due to the external moisture may be effectively prevented.

An encapsulation substrate 700 may be attached on the second electrode 330 of each light-emitting device 300 by an entire surface adhesive layer 600. For example, the entire surface adhesive layer 600 may include an adhesive material. The encapsulation substrate 700 may prevent the damage of the light-emitting devices 300 due to the external moisture and impact. For example, the encapsulation substrate 700 may include a material having a specific hardness or more. The encapsulation substrate 700 may include a material having relatively high thermal conductivity. For example, the encapsulation substrate 700 may include a metal, such as aluminum (Al), nickel (Ni) and iron (Fe). Thus, in the display apparatus according to the embodiment of the present disclosure, the heat generated by the pixel driving circuit DC and the light-emitting device 300 of each pixel area PA may be dissipated through the encapsulation substrate 700. Therefore, in the display apparatus according to the embodiment of the present disclosure, the deterioration of the light-emitting layer 320 in each pixel area PA may be effectively prevented.

The entire surface adhesive layer 600 and the encapsulation substrate 700 may extend on the bezel area BZ of the device substrate 100. For example, the moisture blocking hole BH may be filled by the entire surface adhesive layer 600. The encapsulation substrate 700 may overlap the display area AA and the bezel area BZ of the device substrate 100.

FIGS. 5A to 13A and 5B to 13B are views sequentially showing a method of forming the display apparatus according to the embodiment of the present disclosure.

Figure 5A:
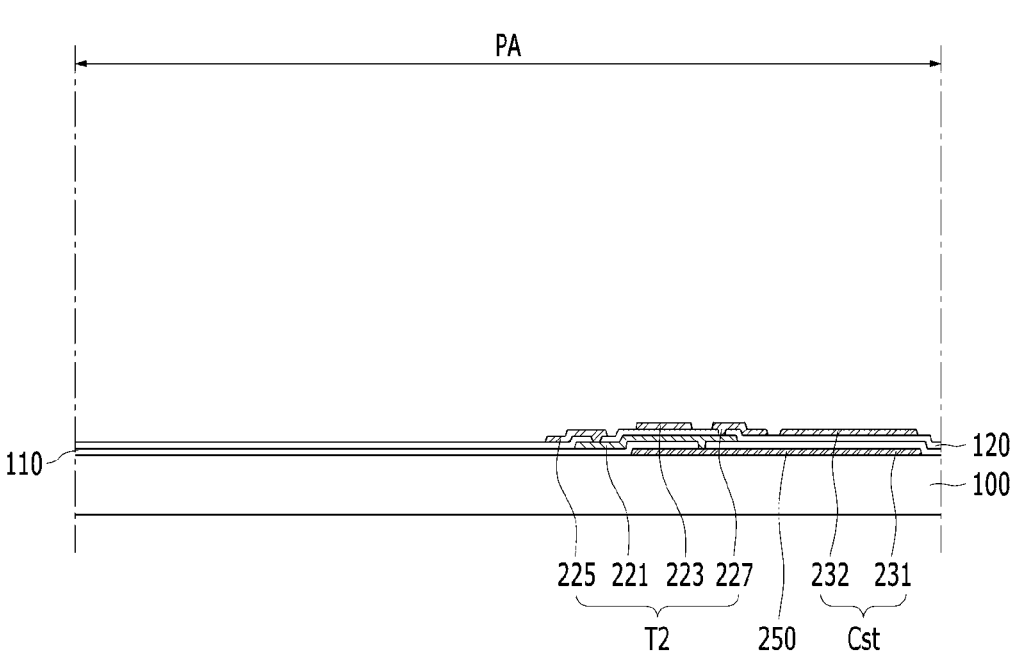
Figure 5B:
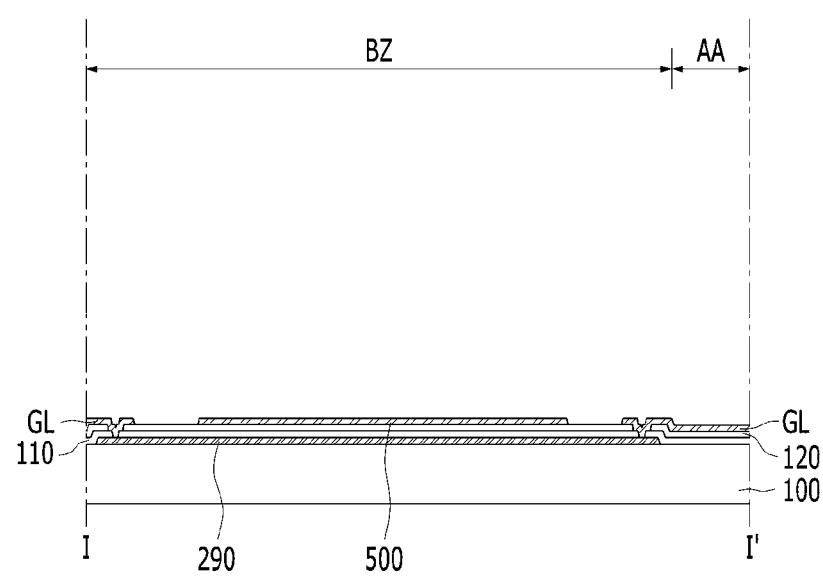

The method of forming the display apparatus according to the embodiment of the present disclosure will be described with reference to FIGS. 3A, 3B, 4, 5A to 13A and 5B to 13B. First, the method of forming the display apparatus according to the embodiment of the present disclosure may include a step of providing a device substrate 100 including a display area AA in which a pixel areas PA is disposed, and a bezel area BZ disposed outside the display area AA, a step of forming a light-blocking pattern 250 on the pixel area PA of the device substrate 100, a step of forming a connecting pattern 290 on the bezel area BZ of the device substrate 100, a step of forming a device buffer layer 110 on the device substrate 100 in which the light-blocking pattern 250 and the connecting pattern 290 are formed, a step of forming a semiconductor pattern 221 on the device buffer layer 110 of the pixel area PA, a step of forming a gate insulating layer 120 on the device substrate 100 in which the semiconductor pattern 221, a step of forming a gate electrode 223, a source electrode 225, a drain electrode 227 and a second capacitor electrode 232 on the gate insulating layer 120 of the pixel area PA, a step of forming a gate line GL on the gate insulating layer 120 of the bezel area BZ, and a step of forming a reflective pattern 500 on the gate insulating layer 120 of the bezel area BZ, as shown in FIGS. 5A and 5B.

The light-blocking pattern 250 may be formed of a material having a high reflectance. The connecting pattern 290 may be formed of a conductive material. The connecting pattern 290 may be formed simultaneously with the light-blocking pattern 250. For example, the step of forming the light-blocking pattern 250 and the connecting pattern 290 may include a step of forming a metal layer having high reflectance on the device substrate 100, and a step of pattering the metal layer. The connecting pattern 290 may include the same material as the light-blocking pattern 250.

The gate electrode 223, the source electrode 225, the drain electrode 227 and the second capacitor electrode 232 may include a conductive material. The gate line GL may include a conductive material. The reflective pattern 500 may include a material having a high reflectance. The gate line GL and the reflective pattern 500 may be formed simultaneously with the gate electrode 223, the source electrode 225, the drain electrode 227 and the second capacitor electrode 232. For example, a step of forming the gate line GL, the reflective pattern 500, the gate electrode 223, the source electrode 225, the drain electrode 227 and the second capacitor electrode 232 may include a step of forming a metal layer having high reflectance on the device substrate 100, and a step of pattering the metal layer. The gate line GL may include the same material as the reflective pattern 500. The gate line GL and the reflective pattern 500 may include the same material as the gate electrode 223, the source electrode 225, the drain electrode 227 and the second capacitor electrode 232.

The gate line GL may be electrically connected to the connecting pattern 290 at the outside of the reflective pattern 500. For example, a step of forming the gate line GL may include a step of exposing an end portion of the connecting pattern 290 by patterning the device buffer layer 110 and the gate insulating layer 120. The reflective pattern 500 may overlap a central region of the connecting pattern 290. The gate line GL may be spaced away from the reflective pattern 500. For example, the gate line GL may bypass a region in which the reflective pattern 500 is formed, using the connecting pattern 290. Thus, in the method of forming the display apparatus according to the embodiment of the present disclosure, the disconnection of the gate line GL due to the reflective pattern 500 may be prevented. And, in the method of forming the display apparatus according to the embodiment of the present disclosure, the penetration of the external moisture through the interface between the device buffer layer 110 and the gate insulating layer 120 may be prevented by the gate line GL.

The semiconductor pattern 221, the gate electrode 223, the source electrode 225 and the drain electrode 227 may constitute a thin film transistor T2. A portion of the light-blocking pattern 250 may constitute a storage capacitor Cst. For example, a portion of the light-blocking pattern 250 overlapping with the second capacitor electrode 232 may function as a first capacitor electrode 231.

Figure 6A:
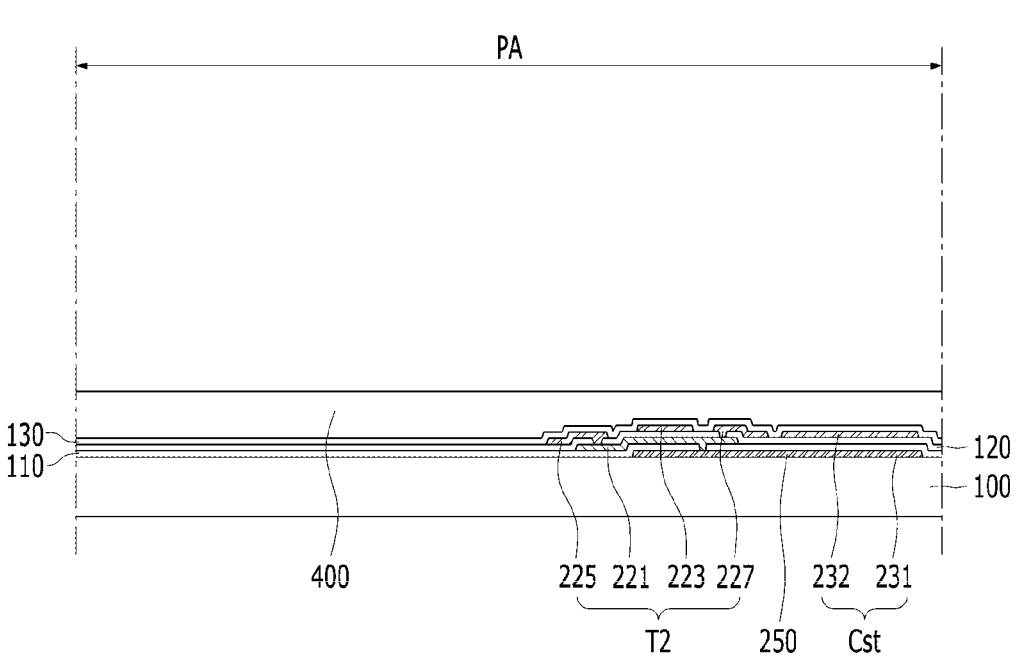
Figure 6B:
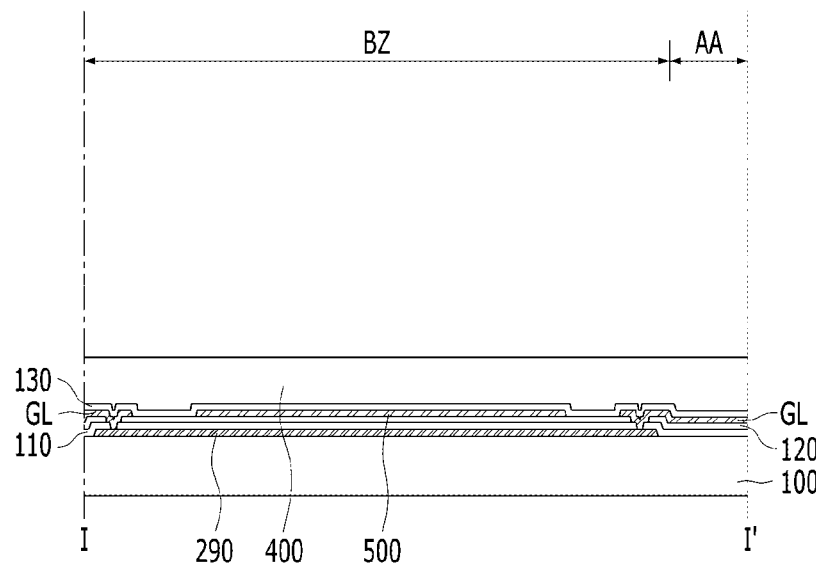

The method of forming the display apparatus according to the embodiment of the present disclosure may include a step of forming a lower passivation layer 130 covering the gate line GL, the reflective pattern 500, the thin film transistor T2 and the storage capacitor Cst on the device substrate 100, and a step of forming a filter material layer 400 on the lower passivation layer 130, as shown in FIGS. 6A and 6B.

The lower passivation layer 130 may be formed of an insulating material. For example, the lower passivation layer 130 may be formed an inorganic insulating material, such as silicon oxide (SiO) and silicon nitride (SiN). For example, a step of forming the lower passivation layer 130 may include a step of depositing an inorganic insulating material on the device substrate 100.

The filter material layer 400 may include a material capable of realizing a specific color using light passing therethrough. For example, the filter material layer 400 may include a dye. The filter material layer 400 may include a photo-sensitive material. For example, the filter material layer 400 may be formed of a material having a negative characteristic in which an area exposed by an exposure process is cured.

Figures 7A, 7B:
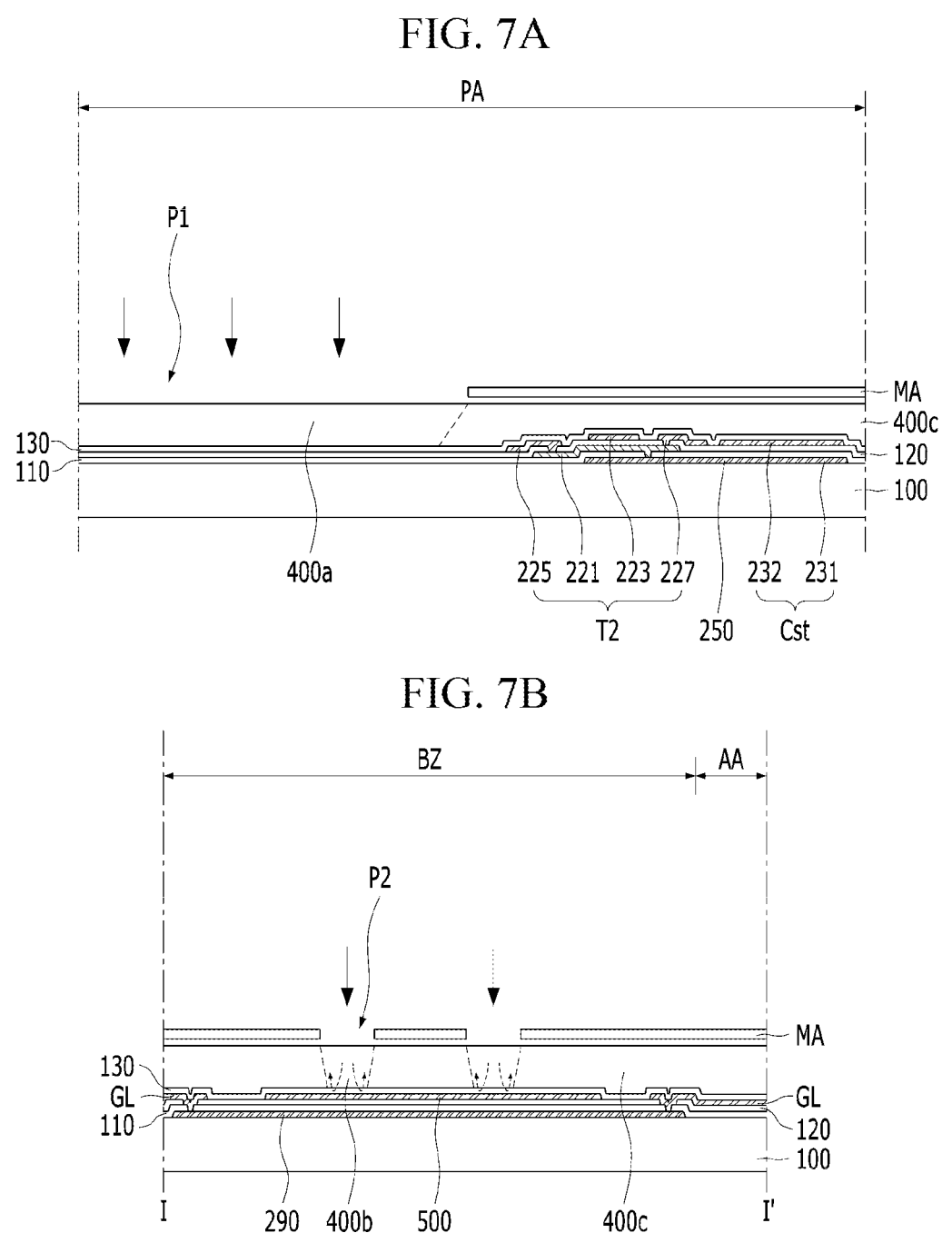

The method of forming the display apparatus according to the embodiment of the present disclosure may include a step of arranging a mask pattern MA including a first opening P1 and at least one second opening P2 on the filter material layer 400, and a step of exposing a portion of the filter material layer 400 using the mask pattern MA, as shown in FIGS. 7A and 7B.

The first opening P1 may overlap a region in which a color filter is formed by a subsequent process. The first opening P1 may be disposed in the pixel area PA. The first opening P1 may not overlap the light-blocking pattern 250, the thin film transistor T2 and the storage capacitor Cst. For example, the first opening P1 may be disposed outside the light-blocking pattern 250, the thin film transistor T2 and the storage capacitor Cst.

The second opening P2 may overlap a region in which a separating partition is formed by a subsequent process. For example, the second opening P2 may be disposed on the bezel area BZ. The second opening P2 may overlap the reflective pattern 500. Thus, in the method of forming the display apparatus according to the embodiment of the present disclosure, the light passing through the second opening P2 may be reflected in a direction of the filter material layer 400 by the reflective pattern 500 in the exposure process. That is, in the method of forming the display apparatus according to the embodiment of the present disclosure, the light reflected by the reflective pattern 500 may expose an lower end of the filter material layer 400 overlapping with the second opening P2. Therefore, in the method of forming the display apparatus according to the embodiment of the present disclosure, a side portion of a second region 400*b* exposed by the second opening P2 may be harder than a side portion of a first region 400*a* exposed by the first opening P1. The light may be not irradiated to a third region 400*c* of the filter material layer 400 overlapping with the mask pattern MA in the exposure process. That is, the third region 400*c* of the filter material layer 400 may be not exposed in the exposure process.

Figure 8A:
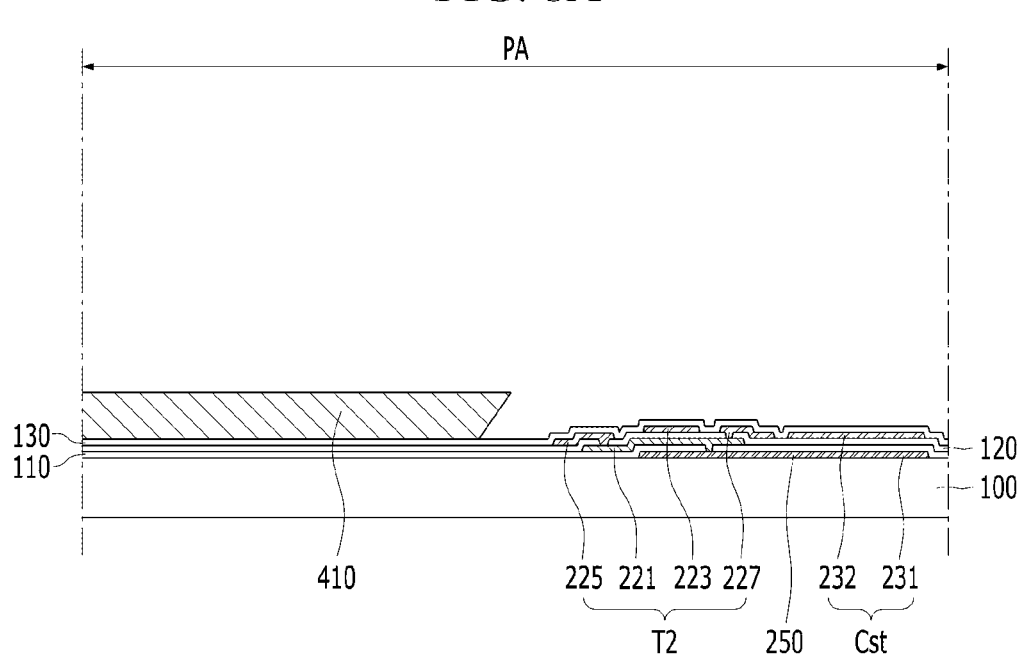
Figure 8B:
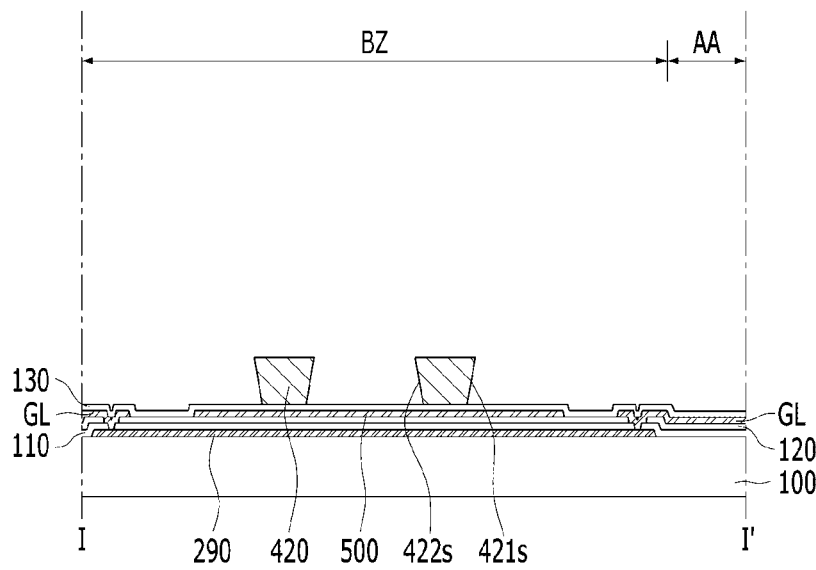

The method of forming the display apparatus according to the embodiment of the present disclosure may include a step of forming a color filter 410 and at least one separating partition 420 on the lower passivation layer 130, as shown in FIGS. 8A and 8B.

The step of forming the color filter 410 and the separating partition 420 may include a step of removing the third region 400*c* of the filter material layer 400 which is not exposed by the mask pattern MA. The color filter 410 may be formed on the lower passivation layer 130 of the pixel area PA. The separating partition 420 may be formed on the lower passivation layer 130 of the bezel area BZ. For example, the color filter 410 may be formed using the first region 400*a* of the filter material layer 400 exposed by the first opening P1, and the separating partition 420 may be formed using the second region 400*b* of the filter material layer 400 exposed by the second opening P2. A side of the color filter 410 may be the same as a side of the first region 400*a*, and a side of the separating partition 420 may be the same as a side of the second region 400*b*. For example, a first separation side 421*s* toward the display area AA and a second separation side 422*s* opposite to the first separation side 421*s* of the separating partition 420 may have a negative tapered shape. The first separation side 421*s* and the second separation side 422*s* of the separating partition 420 may have an inclination angle greater than the side of the color filter 410. The separating partition 420 may have the same thickness as the color filter 410.

Figure 9A:
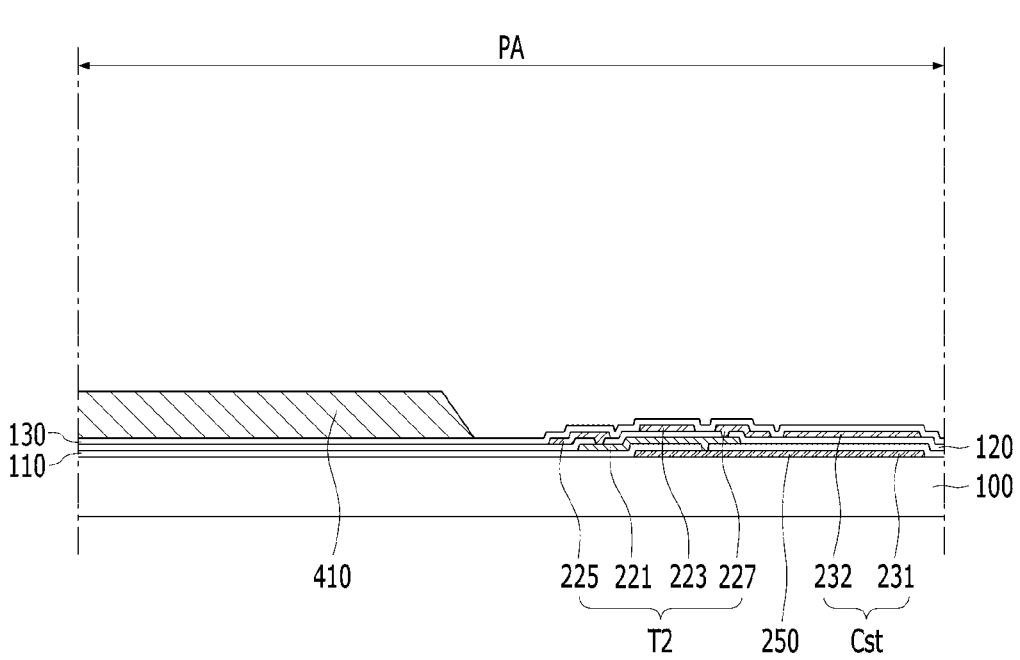
Figure 9B:
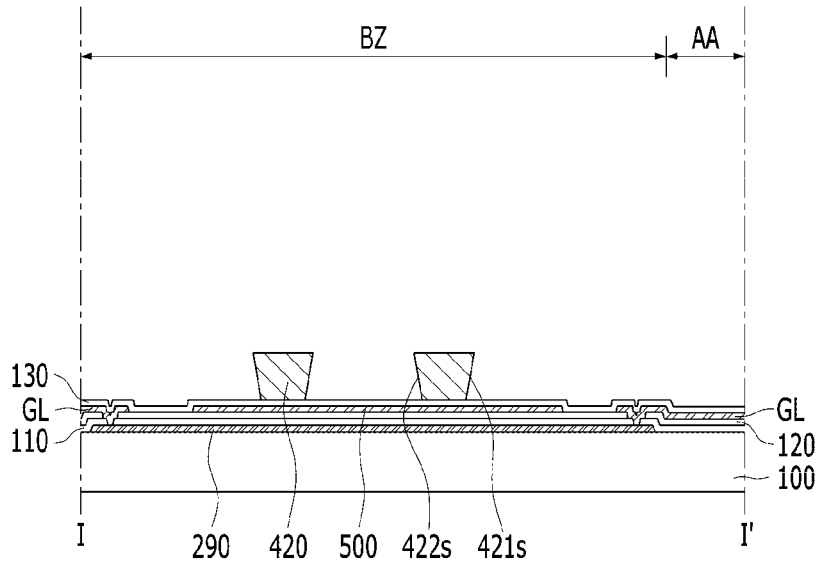

The method of forming the display apparatus according to the embodiment of the present disclosure may include a step of curing the color filter 410 and the separating partition 420, as shown in FIGS. 9A and 9B.

A side portion of the color filter 410 having a gentle slope may flow down in a direction of the lower passivation layer 130 by the curing process. For example, the side of the color filter 410 may have a positive tapered shape by the curing process. The first separation side 421*s* and the second separation side 422*s* of the separating partition 420 having a steep slope may not flow down by the curing process. For example, the first separation side 421*s* and the second separation side 422s of the separating partition 420 may maintain the negative tapered shape, after the curing process is completed.

Figure 10A:
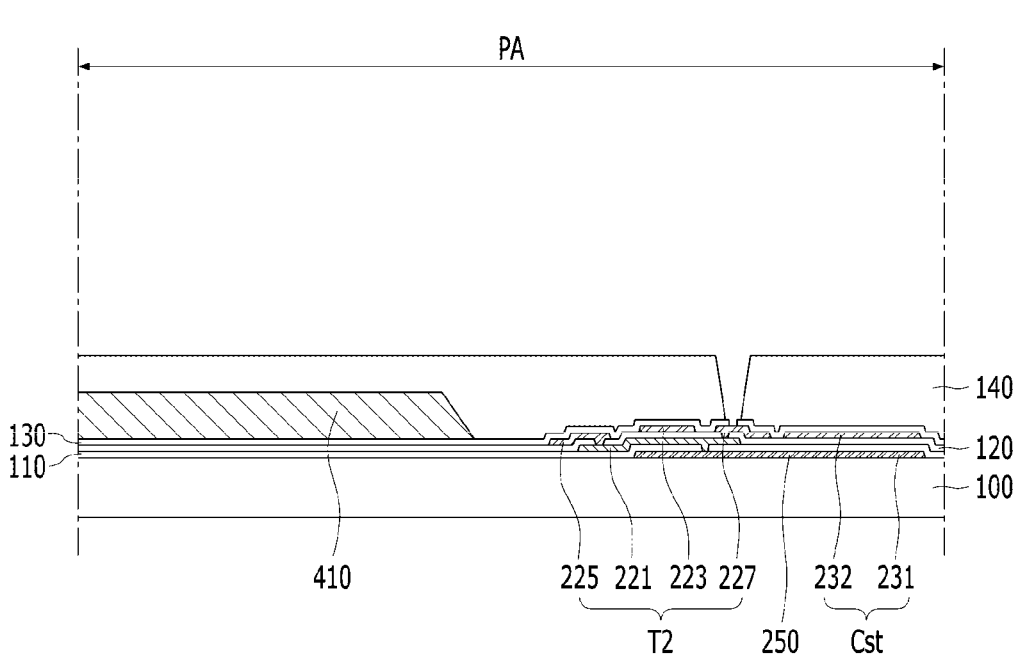
Figure 10B:
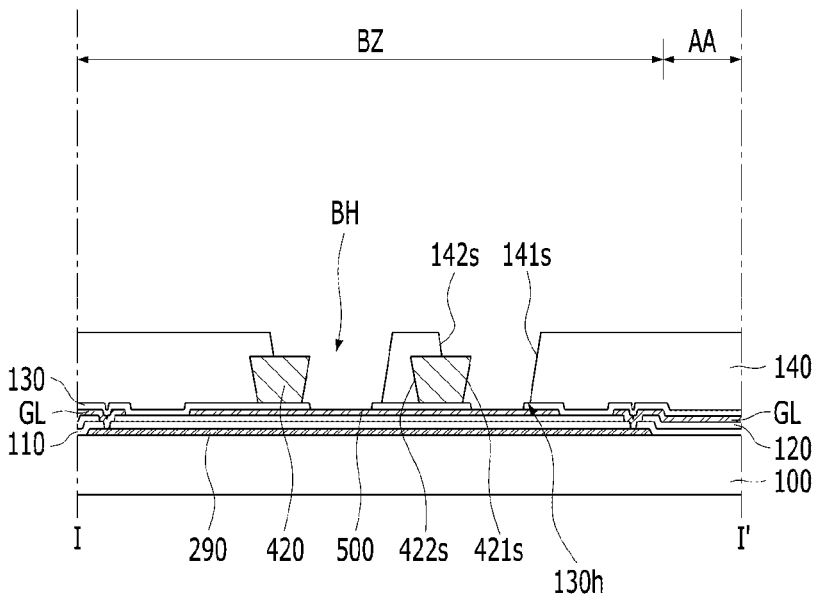

The method of forming the display apparatus according to the embodiment of the present disclosure may include a step of forming an over-coat layer 140 including an electrode contact hole and at least one over penetrating hole 140h on the device substrate 100 in which the color filter 410 and the separating partition 420 are formed, and a step of forming a lower penetrating hole 130h in the lower passivation layer 130, as shown in FIGS. 10A and 10B.

The electrode contact hole may penetrate the over-coat layer 140 of the display area AA. For example, the electrode contact hole may partially expose the drain electrode 227 of the thin film transistor T2. The over penetrating hole 140h may penetrate the over-coat layer 140 of the bezel area BZ. For example, the over penetrating hole 140h may overlap the reflective pattern 500.

The over penetrating hole 140h may have a positive tapered shape. For example, the over penetrating hole 140h may include a first over side 141s toward the display area AA and a second over side 142s opposite to the first over side 141s. The second over side 142s of the over penetrating hole 140h may overlap the separating partition 420. Thus, in the method of forming the display apparatus according to the embodiment of the present disclosure, a moisture blocking hole BH may be defined by the first over side 141s of the over penetrating hole 140h and the first separation side 421s of the separating partition 420. For example, the first over side 141s of the over penetrating hole 140h may be a first blocking side of the moisture blocking hole BH, and the first separation side 421s of the separating partition 420 may be a second blocking side of the moisture blocking hole BH. Therefore, in the method of forming the display apparatus according to the embodiment of the present disclosure, the moisture blocking hole BH defined by the first over side 141s of the over penetrating hole 140h and the first separation side 421s of the separating partition 420 may include the first blocking side 141s having a positive tapered shape and the second blocking side 421s having a negative tapered shape opposite to the first blocking side 141s.

The lower penetrating hole 130h may overlap the moisture blocking hole BH. For example, the lower penetrating hole 130h may be formed between the first over side 141s of the over penetrating hole 140h and the first separation side 421s of the separating partition 420. The lower penetrating hole 130h may penetrate the lower passivation layer 130. A portion of the reflective pattern 500 disposed between the first over side 141s of the over penetrating hole 140h and the first separation side 421s of the separating partition 420 may be exposed by the lower penetrating hole 130h.

Figure 11A:
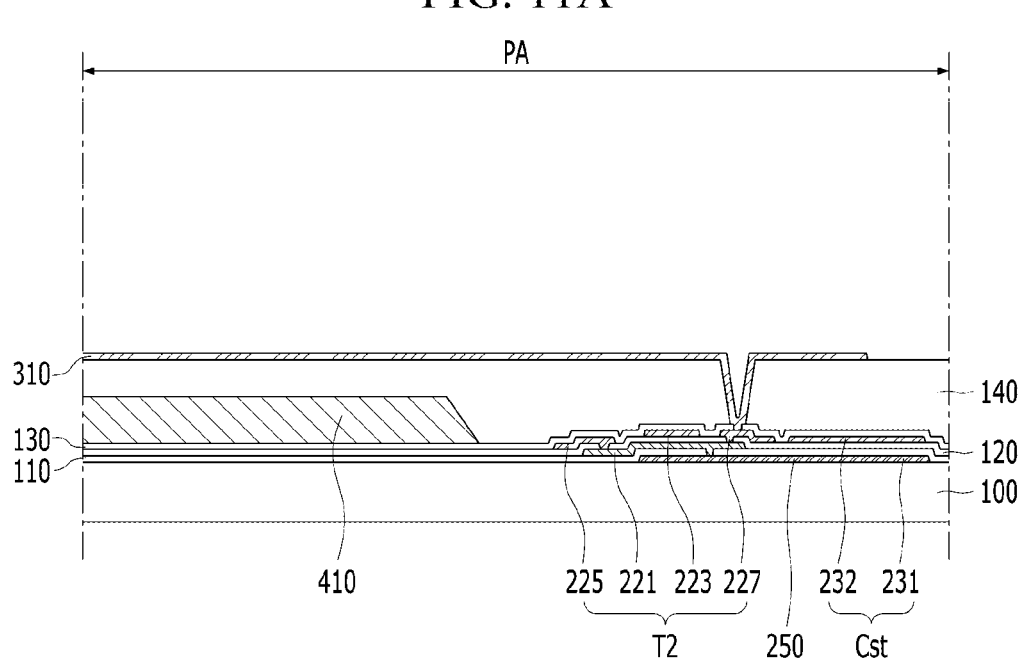
Figure 11B:
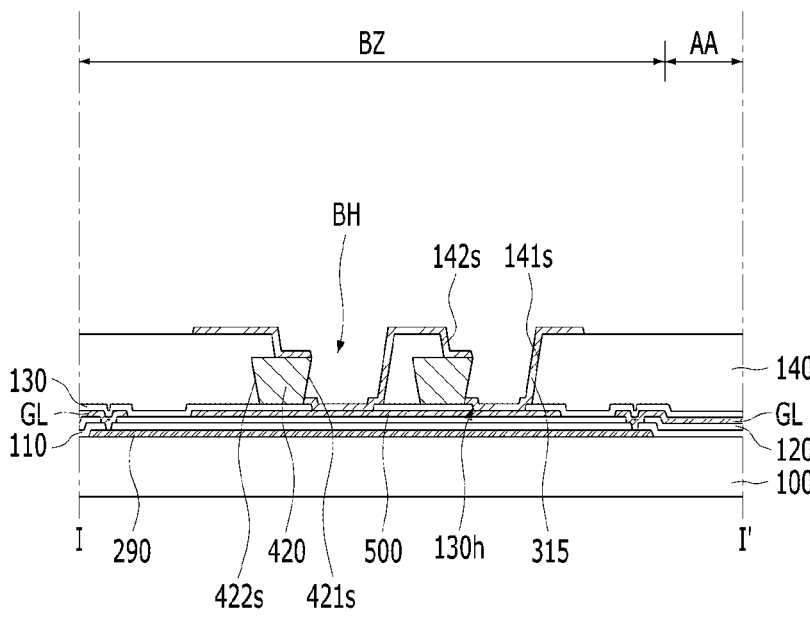

The method of forming the display apparatus according to the embodiment of the present disclosure may include a step of forming a first electrode 310 on the over-coat layer 140 of the pixel area PA, and a step of forming the barrier pattern 315 on the first over side 141s, as shown in FIGS. 11A and 11B.

The first electrode 310 may be electrically connected to the drain electrode 227 of the thin film transistor T2 through the electrode contact hole. The first electrode 310 may include a conductive material. The barrier pattern 315 may include a conductive material. The barrier pattern 315 may be formed simultaneously with the first electrode 310. For example, a step of the first electrode 310 and the barrier pattern 315 may include a step of forming a conductive material layer on the device substrate 100 in which the electrode contact hole and the moisture blocking hole BH, and a step of patterning the conductive material layer.

The conductive material layer may be partially separated by the first separation side 421s of the separating partition 420, which is disposed inside the over penetrating hole 140h. For example, the first separation side 421s of the separating partition 420 may be not covered by the conductive material layer. An end portion of the barrier pattern 315 may be disposed inside the moisture blocking hole BH. The other end portion of the barrier pattern 315 may be disposed on the over-coat layer 140 of the bezel area BZ.

Figure 12A:
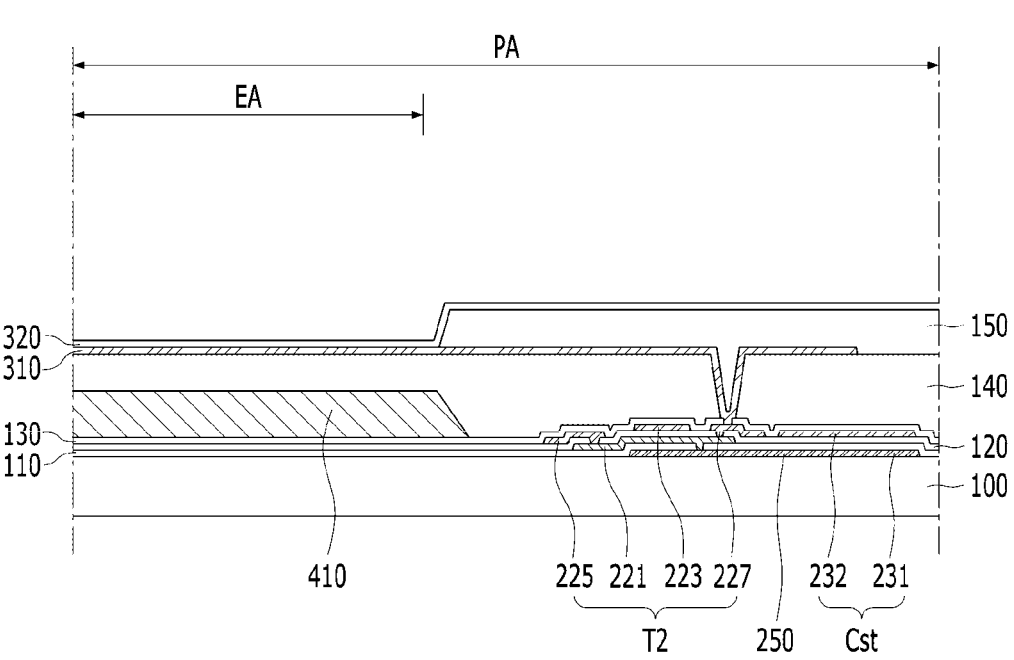
Figure 12B:
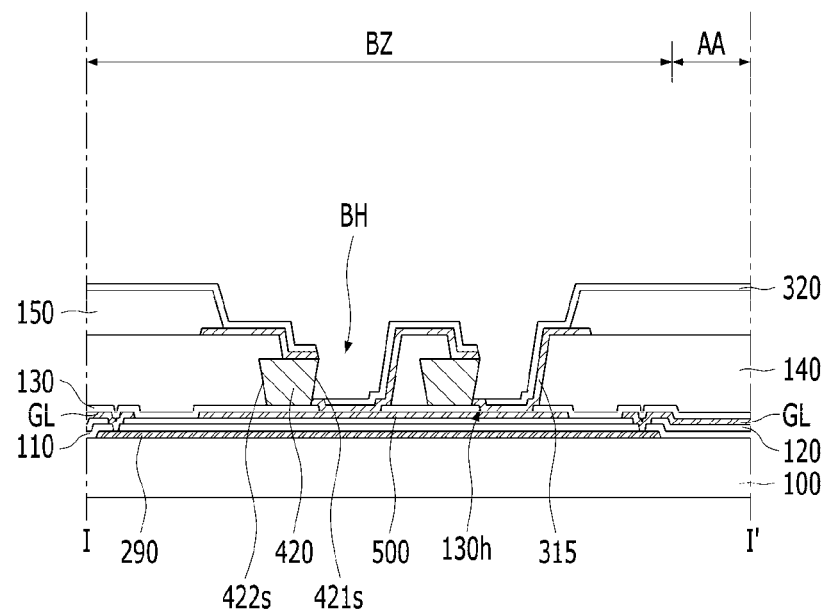

The method of forming the display apparatus according to the embodiment of the present disclosure may include a step of forming a bank insulating layer 150 on the device substrate 100 in which the first electrode 310 and the barrier pattern 315 are formed, and a step of forming a light-emitting layer 320 on the device substrate 100 in which the bank insulating layer 150 is formed, as shown in FIGS. 12A and 12B.

The bank insulating layer 150 may expose a portion of the first electrode 310. The light-emitting layer 320 may be in contact with the portion of the first electrode 310 exposed by the bank insulating layer 150. For example, the bank insulating layer 150 may define an emission area EA in the pixel area PA. An edge of the first electrode 310 may be covered by the bank insulating layer 150.

The bank insulating layer 150 may expose the moisture blocking hole BH and separating partition 420. For example, the light-emitting layer 320 may be partially separated by the first separation side 421s of the separating partition 420. The light-emitting layer 320 may include an end portion disposed inside the moisture blocking hole BH. For example, an end portion of the light-emitting layer 320 may be disposed on the barrier layer 315. The light-emitting layer 320 may be in direct contact with the barrier pattern 315 in the moisture blocking hole BH. An end portion of the light-emitting layer 320 may be separated from the separating partition 420 due to a thickness different by the lower penetrating hole 130h.

Figure 13A:
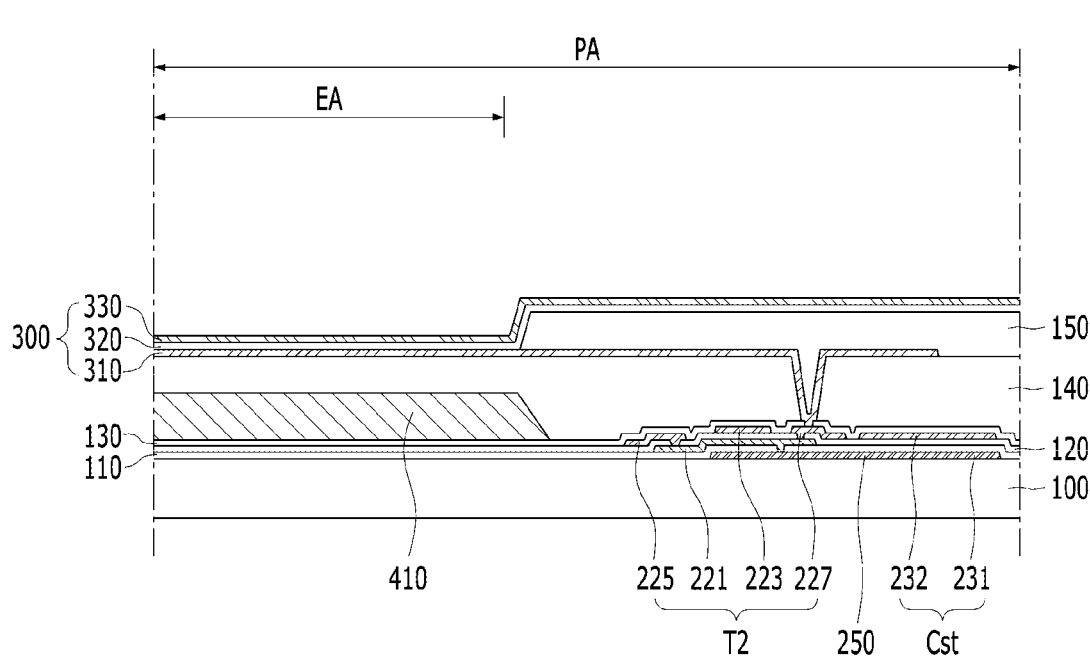
Figure 13B:
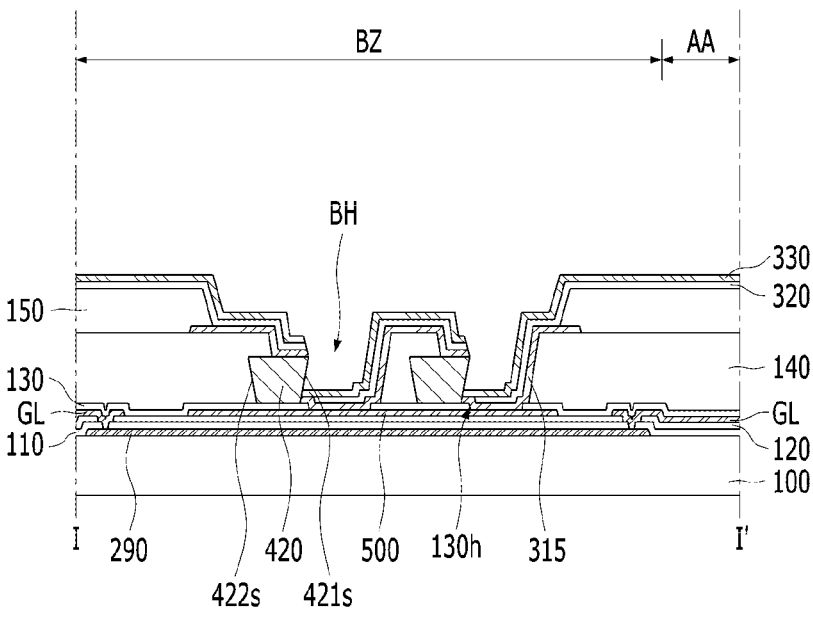

The method of forming the display apparatus according to the embodiment of the present disclosure may include a step of forming a second electrode 330 on the light-emitting layer 320, as shown in FIGS. 13A and 13B.

A portion of the second electrode 330 formed on the emission area EA may constitute a light-emitting device 300 together with the portion of the first electrode 310 exposed by the bank insulating layer 150 and a portion of the light-emitting layer 320 on the portion of the first electrode 310.

The second electrode 330 formed on the bezel area BZ may be partially separated by the first separation side 421s of the separating partition 420. For example, the second electrode 320 may include an end portion disposed in the moisture blocking hole BH. The second electrode 330 may be formed of a material and process having better step coverage than the light emitting layer 320. For example, the second electrode 330 may be in direct contact with the barrier pattern 315 at the outside of the light-emitting layer 320. An end portion of the light-emitting layer 320 may be surrounded by the barrier pattern 315 and the second electrode 330. Thus, in the method of forming the display apparatus according to the embodiment of the present disclosure, the penetration of the external moisture through the light-emitting layer 320 may be prevented.

The method of forming the display apparatus according to the embodiment of the present disclosure may include a step of attaching an encapsulation substrate 700 using an entire surface adhesive layer 600 on the second electrode 330, as shown in FIGS. 3A and 3B.

The step of attaching the encapsulation substrate 700 may include a step of forming the entire surface adhesive layer 600 on the encapsulation substrate 700. For example, the moisture blocking hole BH may be filled by the entire surface adhesive layer 600. The first separation side 421s of the separating partition 420 in which the light-emitting layer 320 and the second electrode 330 are not formed may be in direct contact with the entire surface adhesive layer 800.

Accordingly, the display apparatus according to the embodiment of the present disclosure and the method of forming the same may include a step of forming the separating partition 420 having a negative tapered side on the bezel area BZ using the reflective pattern 500, a step of forming the lower penetrating hole 130h overlapping with the moisture blocking hole BH defined by the separating partition 420 and the over penetrating hole 140h penetrating the over-coat layer 140 of the bezel area BZ, and a step of forming the barrier pattern 315 covering the first blocking side 141s of the moisture blocking hole BH using a process of forming the first electrode 310. Thus, in the display apparatus according to the embodiment of the present disclosure and the method of forming the same, the end portion 320e of the light-emitting layer 320 may be surrounded by the barrier pattern 315 and the second electrode 330. Therefore, in the display apparatus according to the embodiment of the present disclosure and the method of forming the same, the deterioration of the light-emitting layer 320 due to the penetration of the external moisture may be effectively prevented.

In the display apparatus according to the embodiment of the present disclosure, a plurality of the moisture blocking holes BH and a plurality of barrier patterns 315 may be formed on the bezel area BZ. Thus, in the display apparatus according to the embodiment of the present disclosure, the penetration of the external moisture through the insulating layers 110, 120, 130, 140 and 150, which are stacked on the bezel area BZ may be effectively prevented. Thus, in the display apparatus according to the embodiment of the present disclosure, lowering the quality of the image due to the external moisture may be effectively prevented.

Figure 14:
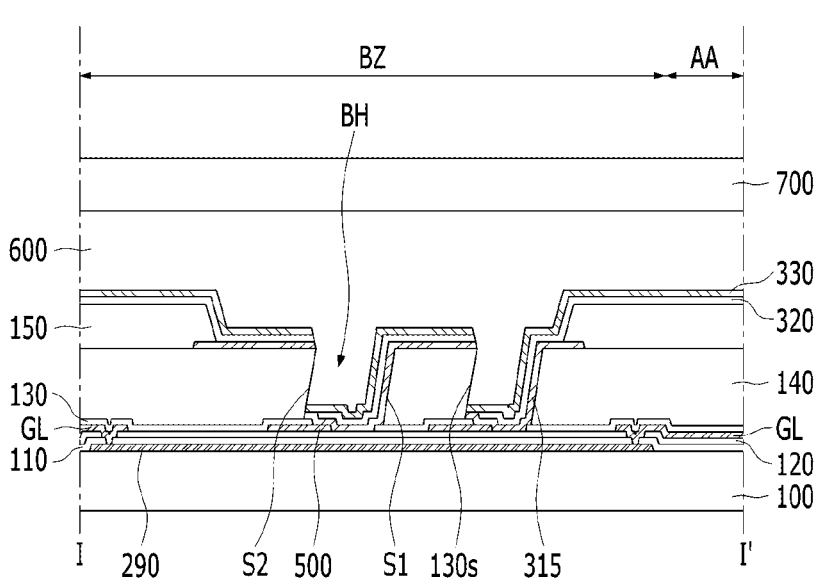
FIG. 14 is a view showing the display apparatus according to an embodiment of the present disclosure.

The display apparatus according to the embodiment of the present disclosure is described that the moisture blocking hole BH is defined by the separating partition 420 including the same material as the color filter 410. However, in the display apparatus according to another embodiment of the present disclosure, the moisture blocking hole BH may be formed in various ways. For example, in the display apparatus according to another embodiment of the present disclosure, the moisture blocking hole BH including a first blocking side S1 having a positive tapered shape and a second blocking side S2 having a negative tapered shape may be formed by the over-coat layer 130 of the bezel area BZ, as shown in FIG. 14. The reflective pattern 500 overlapping with the second blocking side S2 may be spaced away from the first blocking side S1. For example, the lower penetrating hole 130h overlapping with the moisture blocking hole BH may expose an end portion of the reflective pattern 500.

Figure 15:
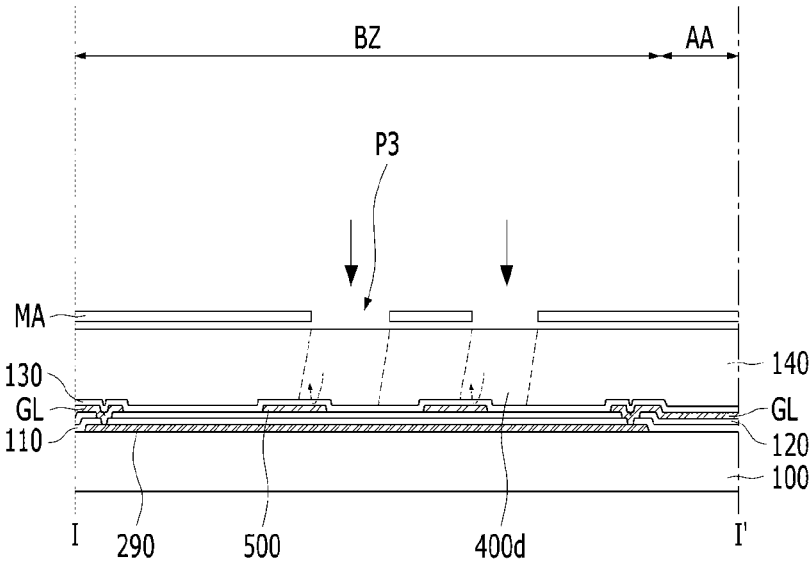
FIGS. 15 and 16 are views sequentially showing the method of forming the display apparatus according to an embodiment of the present disclosure.
Figure 16:
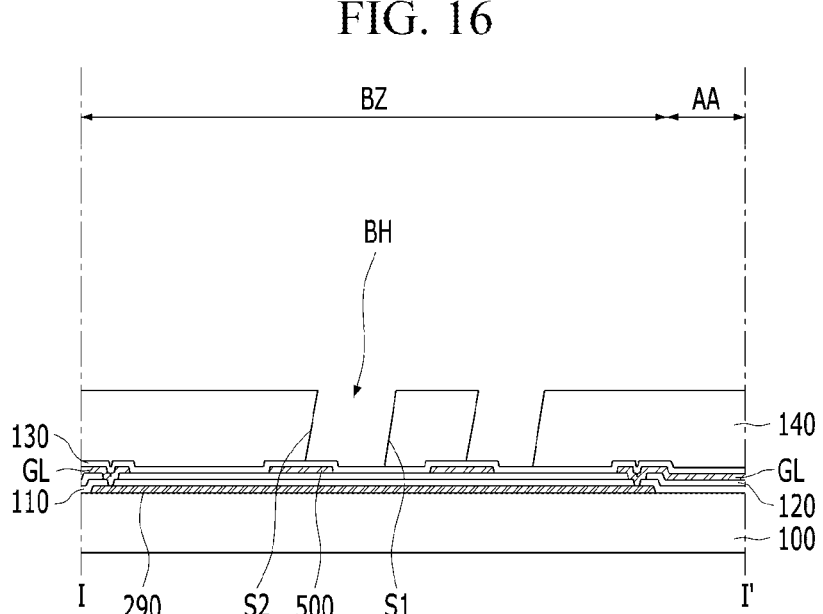

FIGS. 15 and 16 are views sequentially showing a method of forming the display apparatus according to another embodiment of the present disclosure.

The method of forming the display apparatus according to another embodiment of the present disclosure will be described with reference to FIGS. 14 to 16. First, the method of forming the display apparatus according to another embodiment of the present disclosure may include a step of forming reflective patterns 500 at the same time as a gate line GL, a step of forming a lower passivation layer 130 and a filter material layer 400 on a device substrate 100 in which the reflective patterns 500 are formed, a step of arranging a mask pattern MA including openings P3 overlapping with an end portion of each reflective pattern 500 on the filter material layer 400, and a step of exposing a portion of the filter material layer 400 using the mask pattern MA, as shown in FIG. 15.

The filter material layer 400 may include a photo-sensitive material. For example, the filter material layer 400 may be formed of a material having a positive characteristic in which an area exposed by an exposure process is removed.

The reflective patterns 500 may be spaced away from each other. Each of the openings P3 may overlap one of the reflective patterns 500. For example, an end portion of each reflective pattern 500 may overlap the mask pattern MA, and the other end of each reflective pattern 500 may overlap one of the opening P3. Thus, in the display apparatus according to another embodiment of the present disclosure, only a lower end of the regions of the filter material layer 400 overlapping each opening P3 may be exposed by light reflected by the reflective patterns 500. For example, in the display apparatus according to another embodiment of the present disclosure, each of exposed regions 400d of the filter material layer 400 by exposure process using the mask pattern MA may have parallel sides.

The method of forming the display apparatus according to another embodiment of the present disclosure may include a step of forming moisture blocking holes BH by removing the exposed regions 400d of the filter material layer 400, as shown in FIG. 16.

The moisture blocking holes BH may have the same shape as the exposed regions 400d. For example, each of the moisture blocking holes BH may include a first blocking side S1 having a positive tapered shape and a second blocking side S2 having a negative tapered shape. The first blocking side S1 of each moisture blocking hole BH may face the display area AA. The second blocking side S2 of each moisture blocking hole BH may be opposite to the display area AA.

The method of forming the display apparatus according to another embodiment of the present disclosure may include a step of removing the lower passivation layer 130 exposed by each moisture blocking hole BH, and a step of forming a bank insulating layer 150, barrier patterns 315, a light-emitting device 300, an entire surface adhesive layer 600 and an encapsulation substrate 700 on the device substrate 100 in which the moisture blocking holes BH are formed, as shown in FIG. 14. Thus, in the display apparatus according to another embodiment of the present disclosure and the method of forming the same, the penetration of the external moisture may be effectively prevented using each moisture blocking hole BH, without the formation of the separating partition. Therefore, in the display apparatus according to another embodiment of the present disclosure and the method of forming the same, the process efficiency may be improved. That is, in the display apparatus according to another embodiment of the present disclosure and the method of forming the same, the degree of freedom for a process of forming the moisture blocking hole BH may be improved.

In the display apparatus according to another embodiment of the present disclosure, the moisture blocking holes BH having various sizes may be formed. Thus, the display apparatus according to another embodiment of the present disclosure may minimize the influence of the moisture blocking holes BH on the signal wiring disposed on the bezel region BZ, and may effectively prevent the penetration of the external moisture.

In the result, the display apparatus according to the embodiments of the present disclosure may comprise the over-coat layer disposed on the display area and the bezel area of the device substrate, the light-emitting device on the over-coat layer of the display area, the moisture blocking hole penetrating the over-coat layer of the bezel area, the lower passivation layer disposed between the device substrate and the over-coat layer, and the barrier pattern disposed on the first blocking side of the moisture blocking hole having a positive tapered shape, wherein the lower passivation layer may include the lower penetrating hole overlapping with the moisture blocking hole, wherein the barrier pattern may extend in the lower penetrating hole, and wherein the light-emitting layer and the second electrode of the light-emitting device may extend on the barrier pattern. Thus, in the display apparatus according to the embodiments of the present disclosure, the penetration of the external moisture through the over-coat layer and the light-emitting layer may be prevented, without increasing the bezel area. Thereby, in the display apparatus according to the embodiments of the present disclosure, the deterioration of the light-emitting layer due to the external moisture may be prevented, without decreasing the display area.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus comprising:
a device substrate including a display area and a bezel area;
a reflective pattern disposed on the bezel area of the device substrate;
a separating partition disposed on the reflective pattern, the separating partition including a first separation side having a negative tapered shape;
an over-coat layer disposed on the device substrate, the over-coat layer including an over penetrating hole, the over penetrating hole having a first over side being spaced away from the first separation side and a second over side overlapping with the separating partition;
a lower passivation layer disposed between the reflective pattern and the separating partition, the lower passivation layer including a lower penetrating hole disposed between the first over side and the first separation side;

a light-emitting device including a first electrode, a light-emitting layer and a second electrode, which are stacked on one another and on the over-coat layer in the display area; and
a barrier pattern disposed on the first over side of the over penetrating hole, the barrier pattern extending inside the lower penetrating hole,
wherein the light-emitting layer and the second electrode extend on the barrier pattern.

2. The display apparatus according to claim 1, wherein an end portion of the light-emitting layer is surrounded by the barrier pattern and the second electrode.

3. The display apparatus according to claim 1, wherein the barrier pattern includes a same material as the first electrode of the light-emitting device.

4. The display apparatus according to claim 3, further comprising a bank insulating layer covering an edge of the first electrode, the bank insulating layer extending on the bezel area of the device substrate,
wherein an end portion of the barrier pattern is disposed between the over-coat layer and the bank insulating layer of the bezel area.

5. The display apparatus according to claim 1, further comprising a thin film transistor disposed between the display area of the device substrate and the lower passivation layer,
wherein the reflective pattern includes a same material as a gate electrode of the thin film transistor.

6. The display apparatus according to claim 5, wherein a gate insulating layer of the thin film transistor extends between the device substrate and the reflective pattern.

7. The display apparatus according to claim 5, further comprising:
a device buffer layer disposed between the device substrate and the thin film transistor, the device buffer layer extending between the device substrate and the reflective pattern;
a connecting pattern disposed between the device substrate and the device buffer layer, the connecting pattern including a region overlapping with the reflective pattern; and
a signal wiring disposed between the device buffer layer and the lower passivation layer, the signal wiring crossing the bezel area,
wherein the signal wiring is connected to a connecting pattern outside of the reflective pattern.

8. The display apparatus according to claim 7, further comprising a light-blocking pattern disposed between the device substrate and the device buffer layer, the light-blocking pattern overlapping with a semiconductor pattern of the thin film transistor,
wherein the connecting pattern includes a same material as the light-blocking pattern.

9. The display apparatus according to claim 1, further comprising a color filter disposed between the lower passivation layer and the over-coat layer, the color filter overlapping with the light-emitting device,
wherein the separating partition includes a same material as the color filter.

10. The display apparatus according to claim 9, wherein a side of the color filter has a positive taper shape.

11. A display apparatus comprising:
a light-emitting device including a first electrode, a light-emitting layer and a second electrode, which are stacked on one another and on a display area of a device substrate;

an over-coat layer disposed between the device substrate and the light-emitting layer, the over-coat layer extending on a bezel area of the device substrate;

a first moisture blocking hole penetrating the over-coat layer of the bezel area, the first moisture blocking hole including a first blocking side having a positive tapered shape and a second blocking side having a negative tapered shape;

a first reflective pattern disposed between the bezel area of the device substrate and the over-coat layer, the first reflective pattern overlapping with the second blocking side of the first moisture blocking hole;

a lower passivation layer disposed between the first reflective pattern and the over-coat layer, the lower passivation layer including a first lower penetrating hole disposed between the first blocking side and the second blocking side; and a first barrier pattern disposed on the first blocking side of the first moisture blocking hole, the first barrier pattern extending inside the first penetrating hole, wherein the light-emitting layer and the second electrode extend on the first blocking side of the first moisture blocking hole.

12. The display apparatus according to claim 11, wherein the first reflective pattern is spaced away from the first blocking side of the first moisture blocking hole.

13. The display apparatus according to claim 11, further comprising:

a second moisture blocking hole disposed on the bezel area of the device substrate, the second moisture blocking hole being spaced away from the first moisture blocking hole; and a second reflective pattern disposed between the bezel area of the device substrate and the over-coat layer, the second reflective pattern being spaced away from the first reflective pattern, wherein the second moisture blocking hole includes a third blocking side having a positive tapered shape and a fourth blocking side having a negative tapered shape, wherein the second reflective pattern overlaps the fourth blocking side of the second moisture blocking hole, and wherein the lower passivation layer includes a second lower penetrating hole disposed between the third blocking side and the fourth blocking side.

14. The display apparatus according to claim 13, further comprising a second barrier pattern disposed on the third blocking side of the second moisture blocking hole, the second barrier pattern extending inside the second lower penetrating hole.

15. The display apparatus according to claim 14, wherein the second barrier pattern includes a same material as the first barrier pattern.

16. A display apparatus comprising:

a substrate including a display area and a bezel area;

a reflective pattern disposed on the bezel area of the substrate;

a separating partition disposed on the reflective pattern;

an over-coat layer disposed on the substrate, the over-coat layer including a first hole overlapping with a portion of the reflective pattern outside the separating partition;

a lower passivation layer disposed between the reflective pattern and the separating partition, the lower passivation layer including a second hole that overlaps with the first hole;

a barrier pattern layer disposed in the second hole and extending into an end of the lower passivation layer overlapping with the first hole; and a light-emitting device including a first electrode, a light-emitting layer and a second electrode stacked on one another and on the over-coat layer in the display area, wherein the separating partition includes a portion exposed by the first hole, and wherein the second electrode extends on the barrier pattern and is in contact with the barrier pattern on the end of the lower passivation layer.

17. The display apparatus according to claim 16, wherein the barrier pattern is in contact with the reflective pattern within the second hole.

18. The display apparatus according to claim 16, wherein at least a portion of a side wall of the separating partition is exposed from the barrier pattern in the first hole.

19. The display apparatus according to claim 16, wherein the first hole includes a first sidewall portion that overlaps the separating partition and a second sidewall portion that offsets from the separating partition.

20. The display apparatus according to claim 19, wherein the reflective pattern overlaps with the first sidewall portion and offsets from the second sidewall portion of the first hole.

\* \* \* \* \*